United States Patent
Hsu et al.

(10) Patent No.: US 12,266,716 B2
(45) Date of Patent: Apr. 1, 2025

(54) FINFET WITH DUMMY FINS AND METHODS OF MAKING THE SAME

(71) Applicant: Taiwan Semiconductor Manufacturing Co., Ltd., Hsin-Chu (TW)

(72) Inventors: Chun-Hao Hsu, New Taipei (TW); Yu-Chun Ko, Hsinchu (TW); Yu-Chang Liang, Kaohsiung (TW); Kao-Ting Lai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/332,936

(22) Filed: Jun. 12, 2023

(65) Prior Publication Data
US 2023/0327005 A1    Oct. 12, 2023

Related U.S. Application Data

(60) Continuation of application No. 17/357,807, filed on Jun. 24, 2021, now Pat. No. 11,677,014, which is a continuation of application No. 17/012,222, filed on Sep. 4, 2020, now Pat. No. 11,049,959, which is a division of application No. 16/261,307, filed on Jan. 29, 2019, now Pat. No. 10,770,571.

(60) Provisional application No. 62/733,188, filed on Sep. 19, 2018.

(51) Int. Cl.
*H01L 29/66* (2006.01)
*H01L 21/02* (2006.01)
*H01L 21/3105* (2006.01)
*H01L 29/78* (2006.01)

(52) U.S. Cl.
CPC ...... *H01L 29/6681* (2013.01); *H01L 21/0228* (2013.01); *H01L 21/31055* (2013.01); *H01L 29/7851* (2013.01)

(58) Field of Classification Search
CPC ............. H01L 29/6681; H01L 29/7851; H01L 29/165; H01L 29/7848; H01L 29/66545; H01L 21/0228; H01L 21/31055; H01L 21/823431; H01L 21/823821; H01L 27/0886; H01L 27/0924
See application file for complete search history.

(56) References Cited

U.S. PATENT DOCUMENTS

| | | | |
|---|---|---|---|
| 8,669,159 B2 | 3/2014 | Juengling | |
| 9,142,537 B2 | 9/2015 | Sudo | |
| 9,508,604 B1 * | 11/2016 | Sung | ..... H01L 29/785 |
| 9,755,073 B1 | 9/2017 | Cheng et al. | |

(Continued)

*Primary Examiner* — Dao H Nguyen
(74) *Attorney, Agent, or Firm* — HAYNES AND BOONE, LLP

(57) ABSTRACT

A semiconductor structure includes a semiconductor fin protruding from a substrate and oriented lengthwise along a first direction, a dielectric fin disposed over the substrate and oriented lengthwise along a second direction perpendicular to the first direction, where the dielectric fin defines a sidewall of the semiconductor fin along the second direction and where the dielectric fin includes a first dielectric layer disposed over a second dielectric layer that differs from the first dielectric layer in composition, and a metal gate stack disposed over the semiconductor fin and oriented lengthwise along the second direction.

20 Claims, 18 Drawing Sheets

(56) References Cited

U.S. PATENT DOCUMENTS

| | | |
|---|---|---|
| 10,510,874 B2 | 12/2019 | Ching et al. |
| 10,529,833 B2 | 1/2020 | Ching et al. |
| 2012/0126883 A1 | 5/2012 | Juengling |
| 2015/0118823 A1 | 4/2015 | Nier et al. |
| 2017/0012042 A1 | 1/2017 | Cai et al. |
| 2017/0194426 A1* | 7/2017 | Min ................ H01L 21/76224 |
| 2017/0358660 A1* | 12/2017 | Cheng ............. H01L 21/02129 |
| 2018/0019171 A1* | 1/2018 | Cheng .............. H01L 29/1037 |
| 2018/0233500 A1 | 8/2018 | Cheng |
| 2019/0067120 A1 | 2/2019 | Ching et al. |
| 2019/0067446 A1 | 2/2019 | Ching et al. |
| 2019/0103304 A1 | 4/2019 | Lin et al. |
| 2019/0148235 A1* | 5/2019 | Wang ............... H01L 29/6681 |
| | | 257/401 |
| 2019/0312140 A1 | 10/2019 | Zhang et al. |
| 2019/0393352 A1* | 12/2019 | Guha .............. H01L 21/02603 |
| 2020/0098888 A1 | 3/2020 | Lin et al. |
| 2021/0320188 A1 | 10/2021 | Hsu et al. |

\* cited by examiner

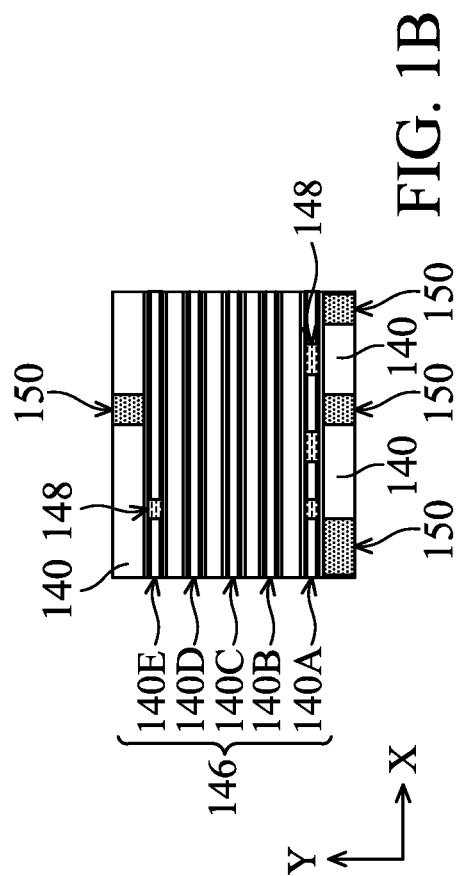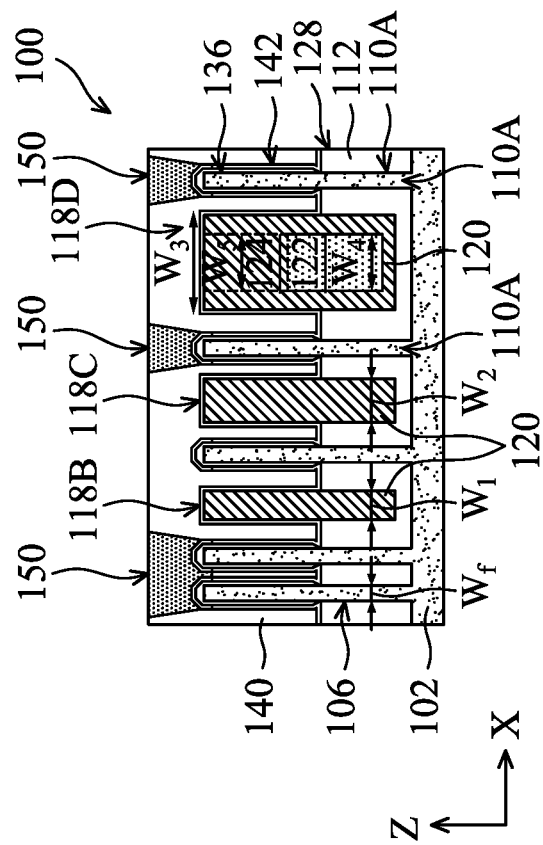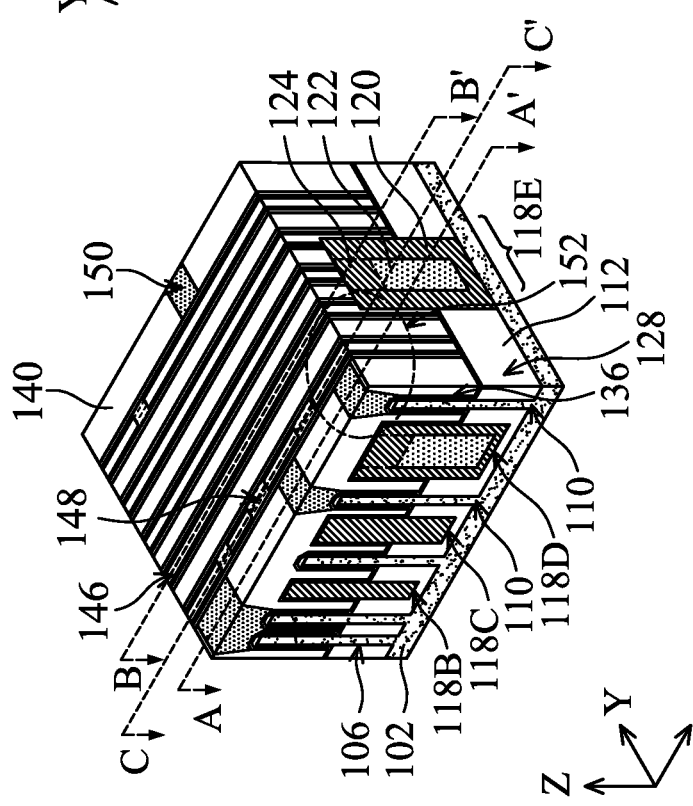
FIG. 1B
FIG. 1C
FIG. 1A

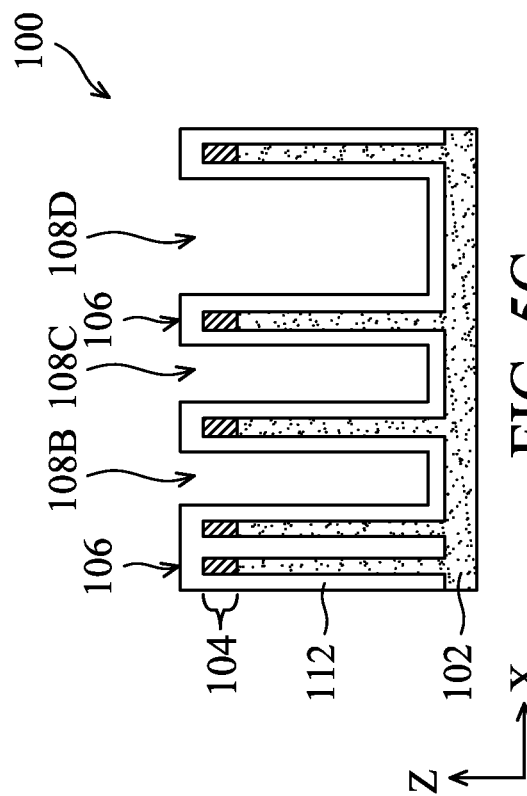
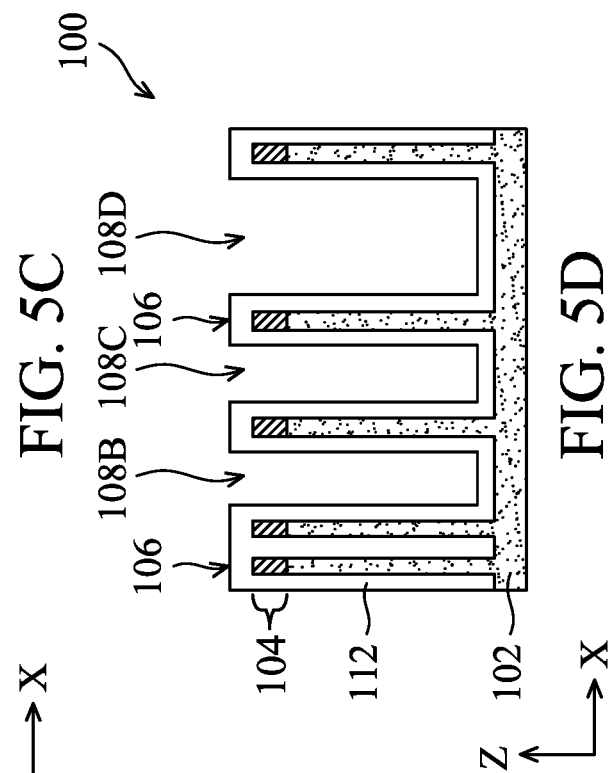
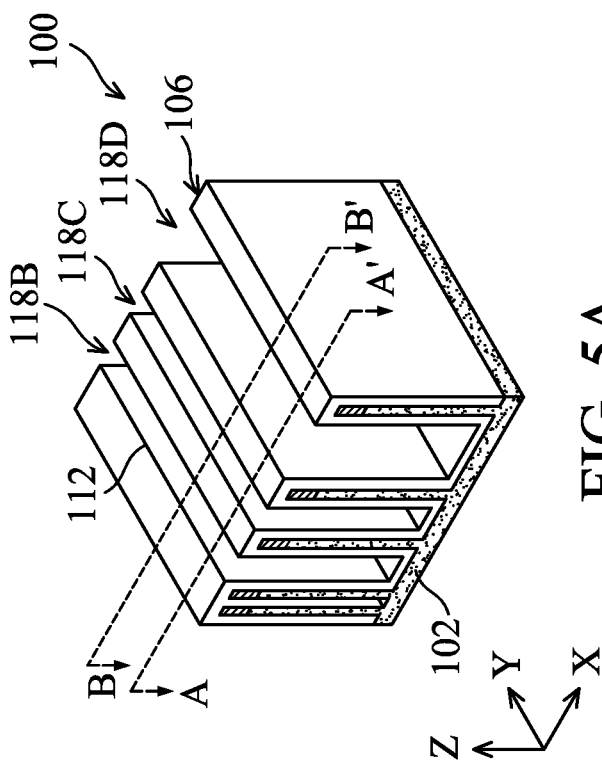
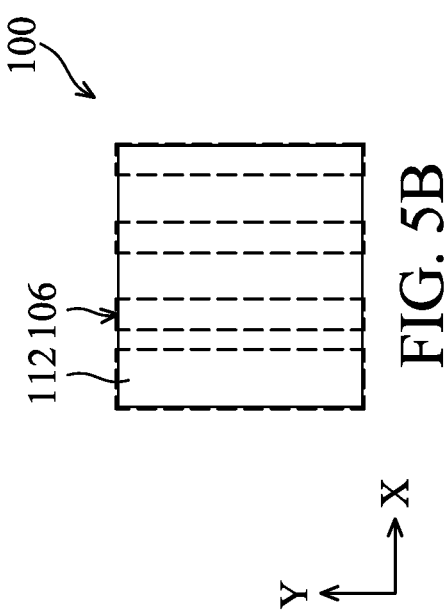

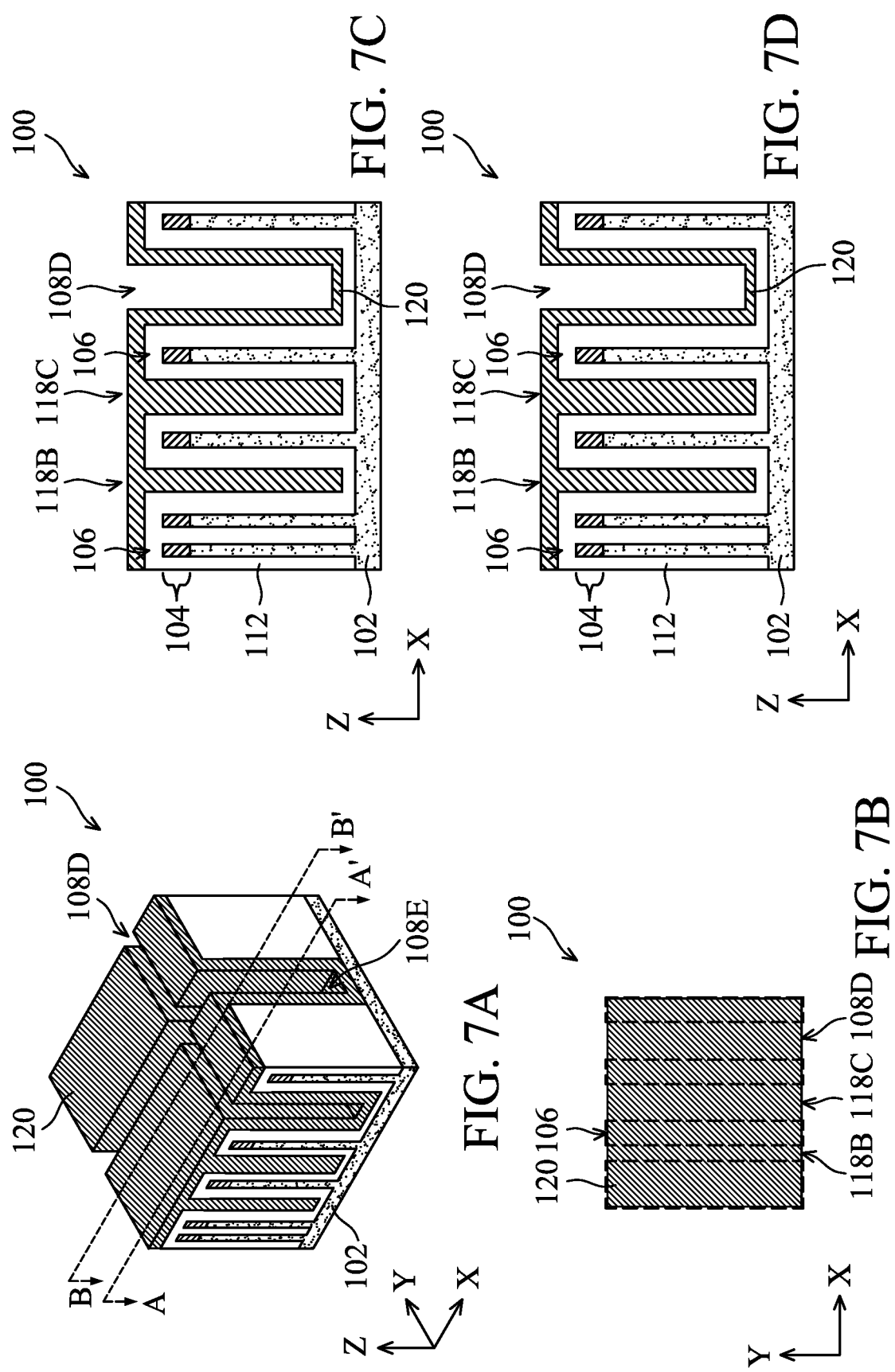

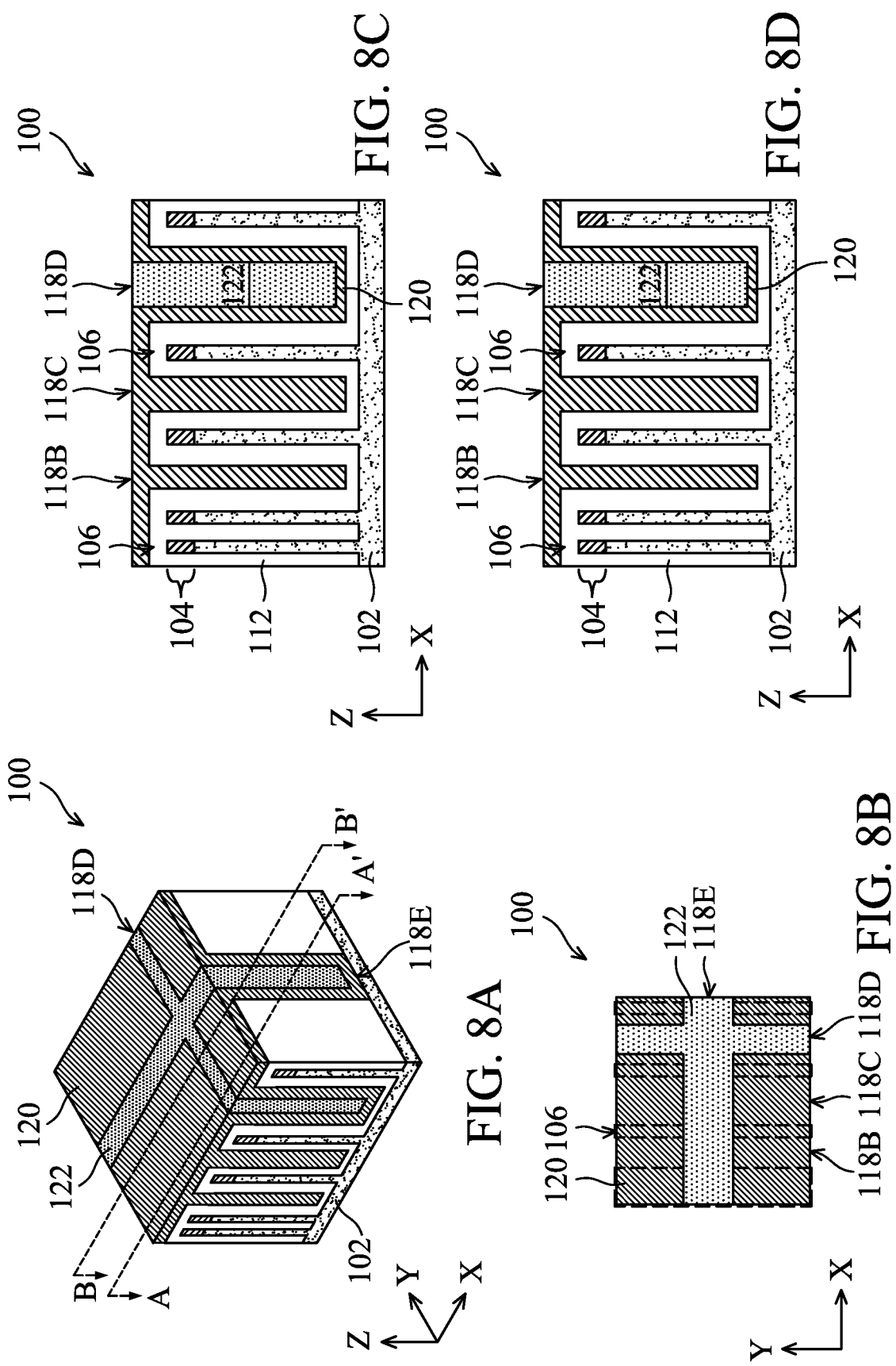

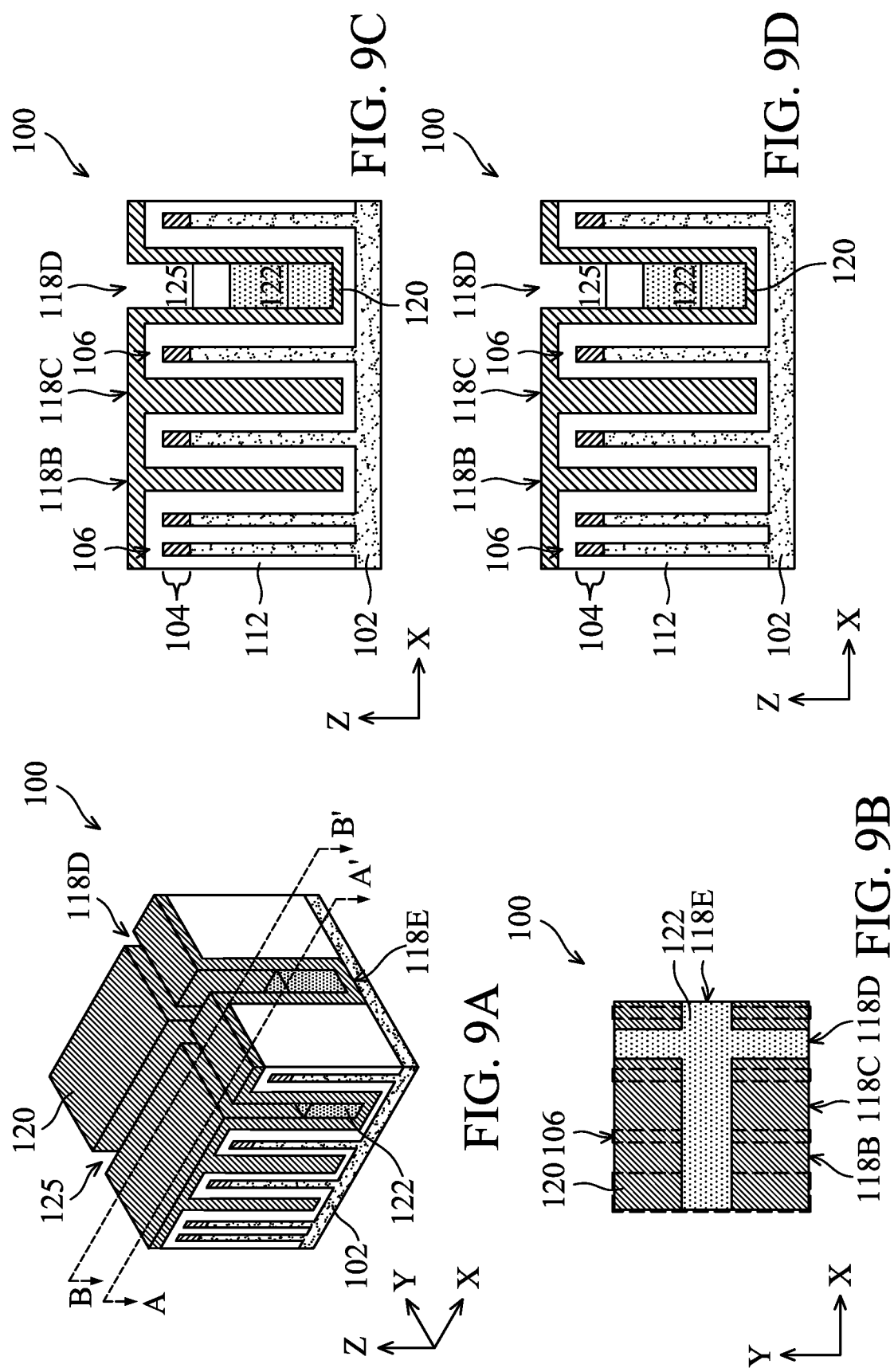

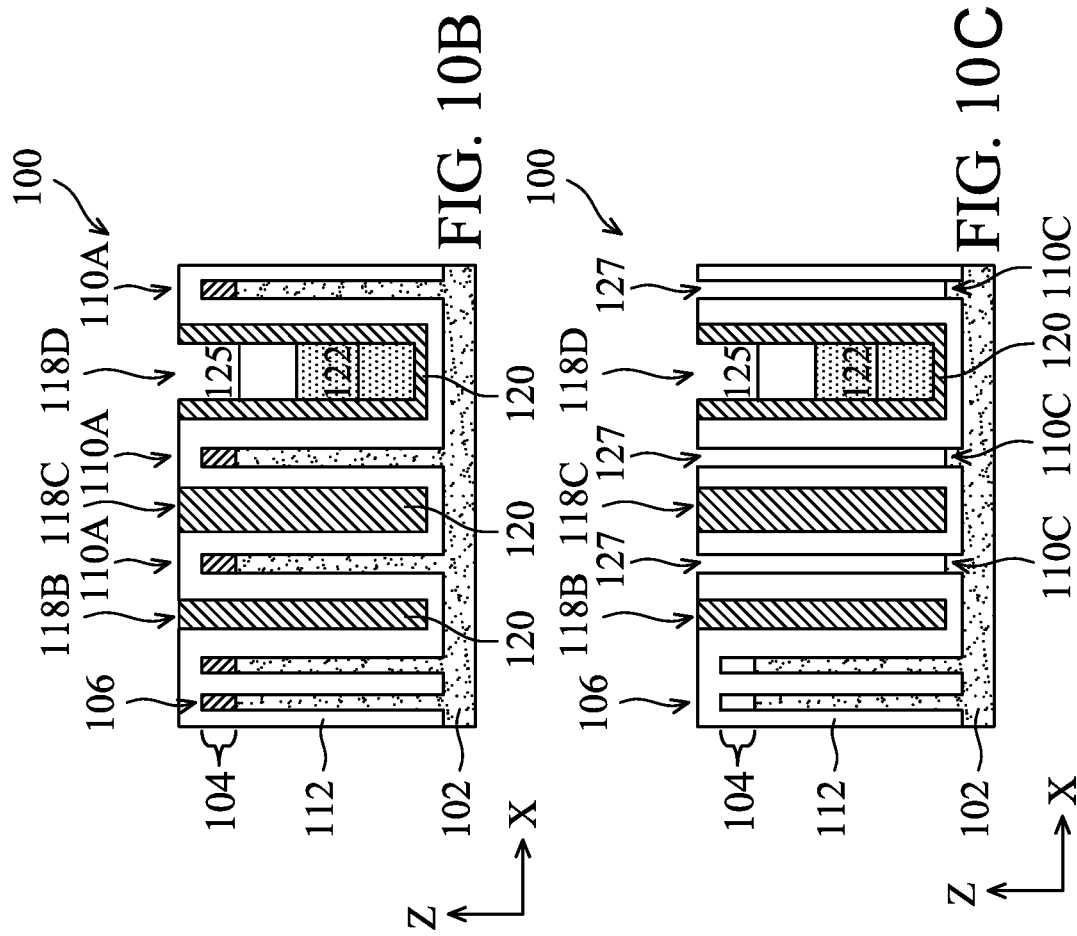
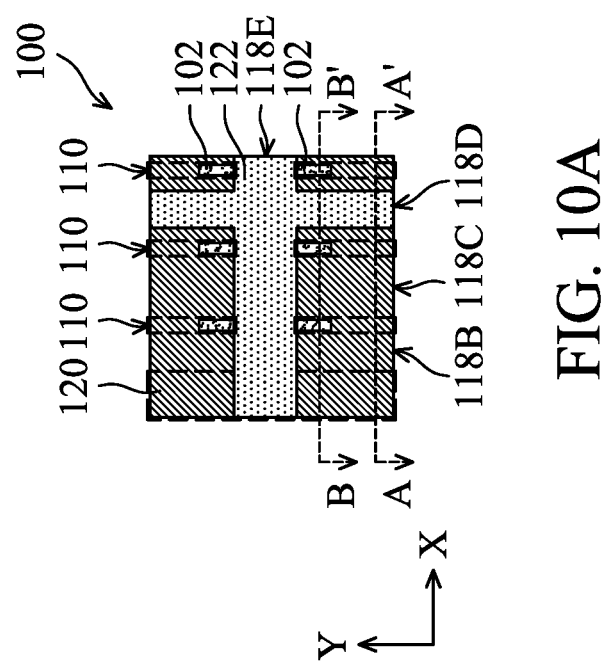

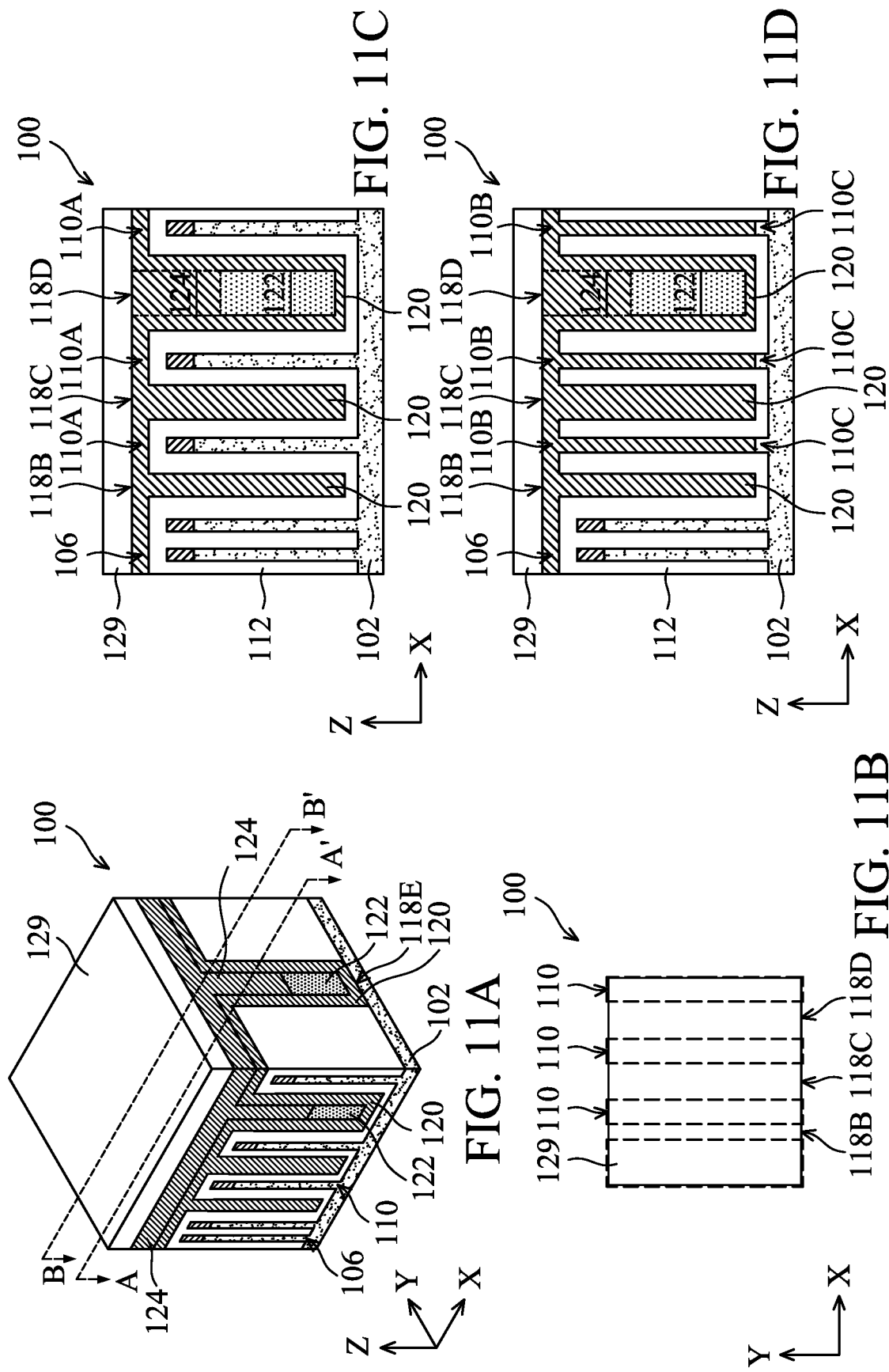

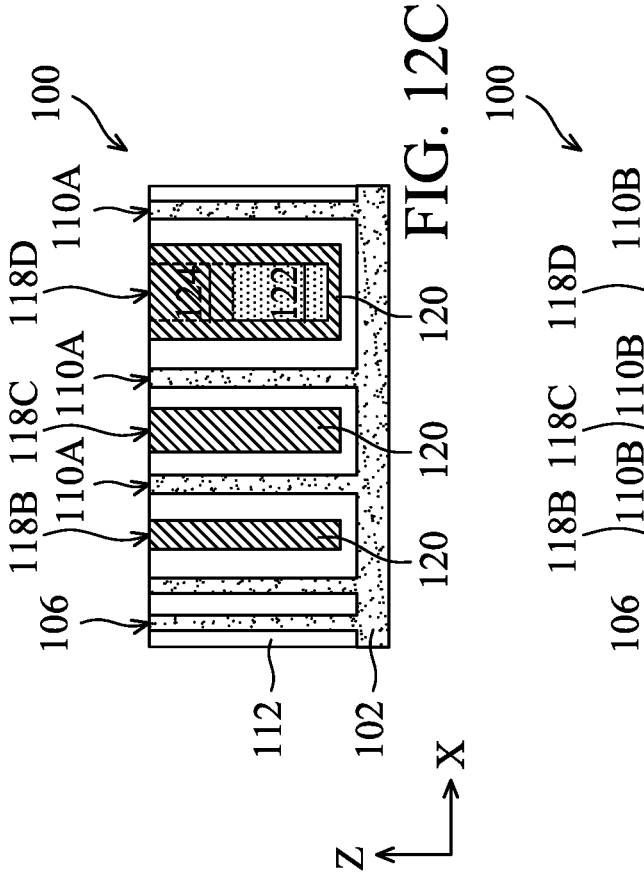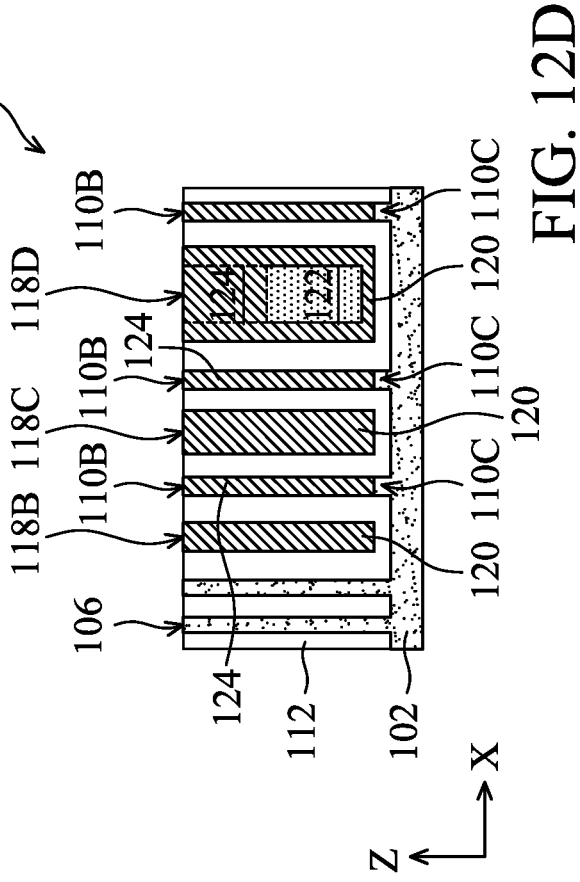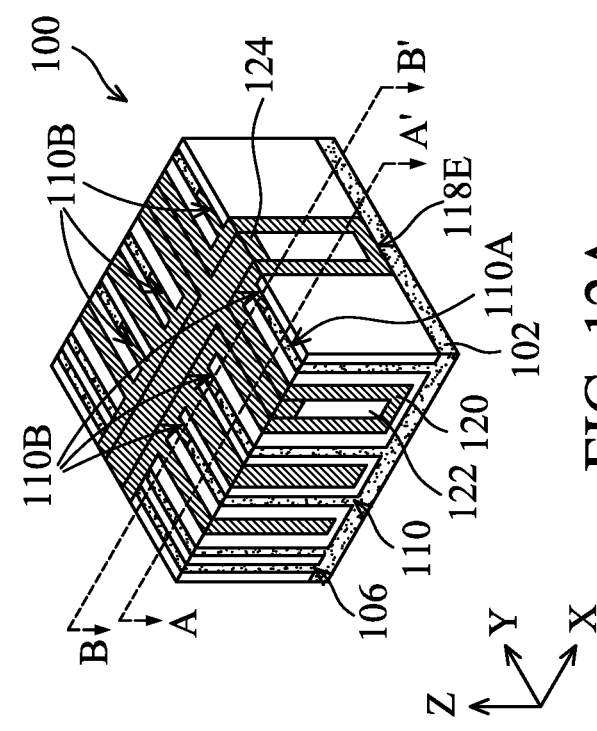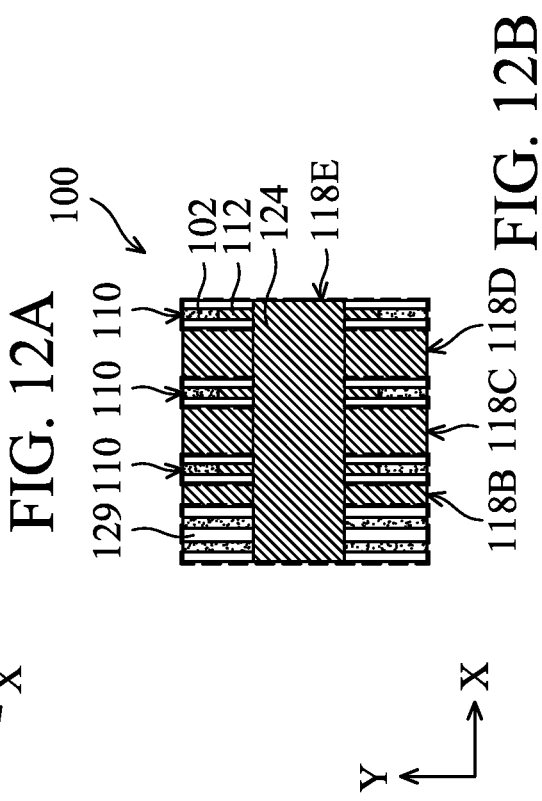

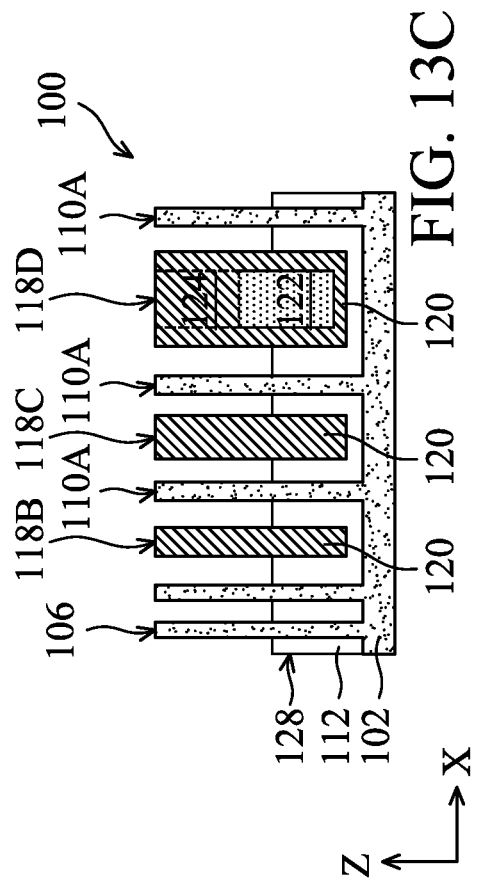
FIG. 13C
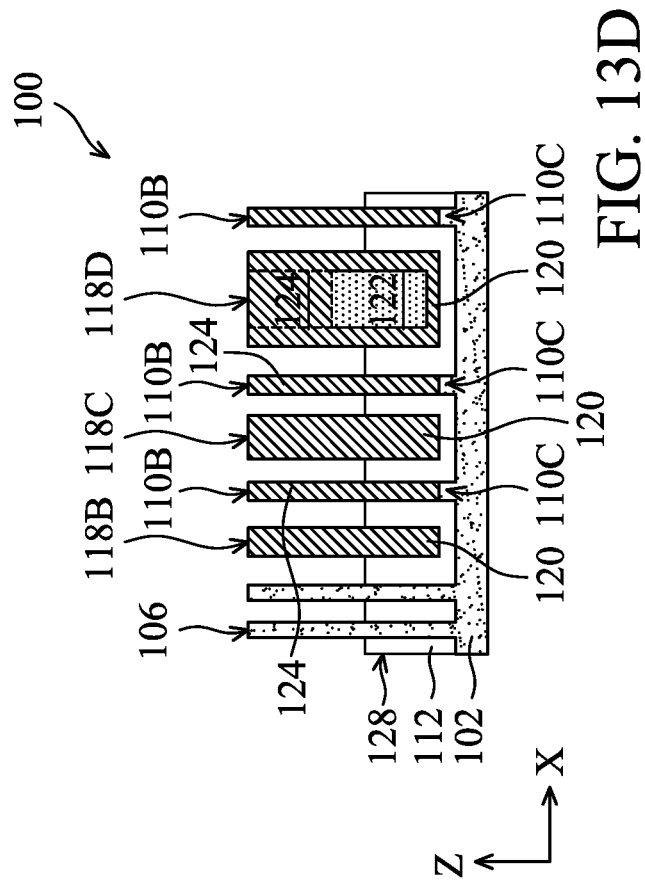
FIG. 13D
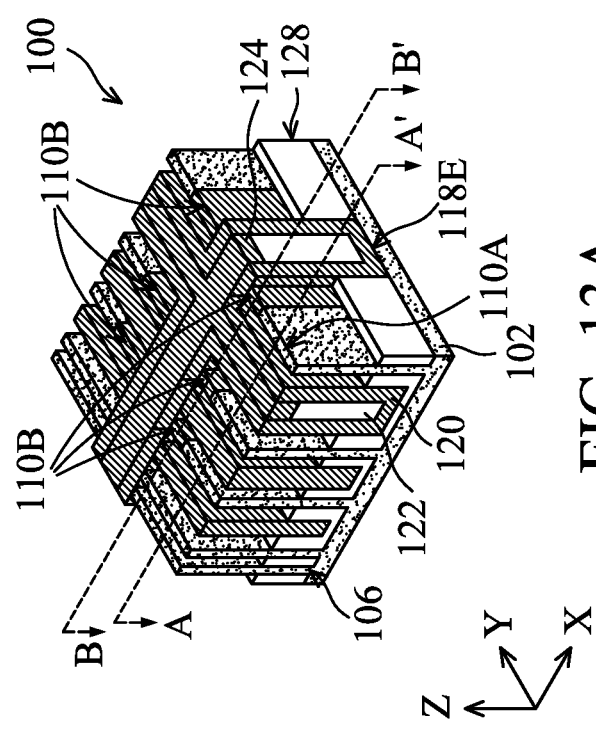
FIG. 13B
FIG. 13A

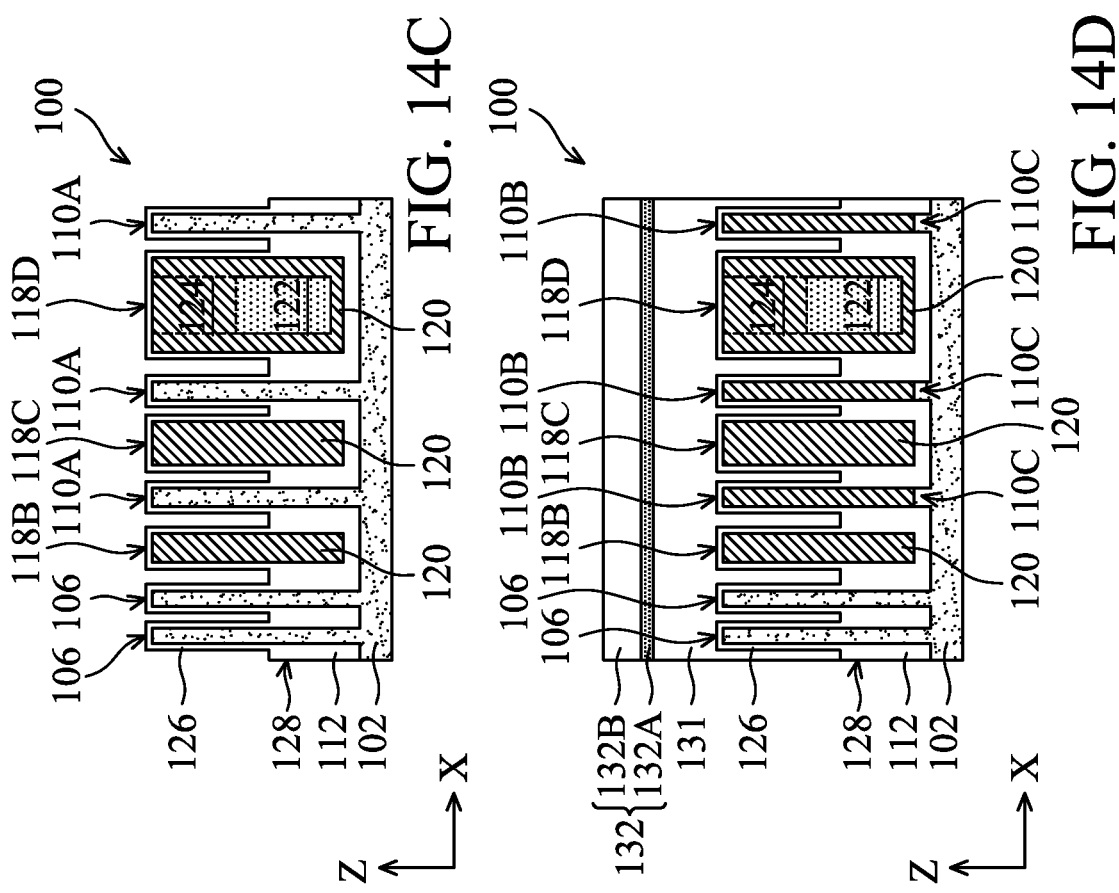
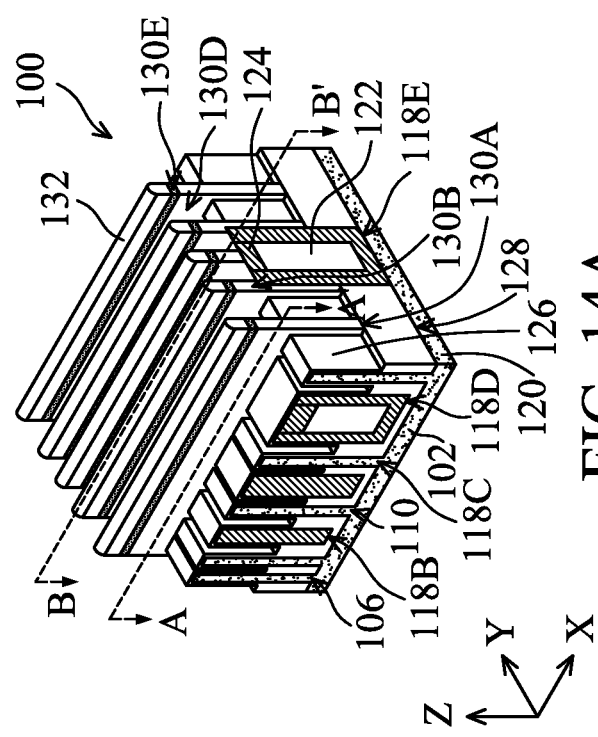

FINFET WITH DUMMY FINS AND METHODS OF MAKING THE SAME

PRIORITY DATA

The present application is a continuation of U.S. patent application Ser. No. 17/357,807, filed Jun. 24, 2021, which is a continuation of U.S. patent application Ser. No. 17/012,222, filed on Sep. 4, 2020, which is a divisional of U.S. patent application Ser. No. 16/261,307, filed on Jan. 29, 2019, which claims priority to U.S. Provisional Patent Application No. 62/733,188, titled "FinFET with Dummy Fins and Methods of Making the Same" and filed on Sep. 19, 2018, each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, a three-dimensional transistor, such as a fin-like field-effect transistor (FinFET), has been introduced to replace a planar transistor. A typical FinFET is fabricated with a thin "fin" (or fin structure) extending up from a substrate. The channel of the FET is formed in this vertical fin, and a gate is formed over (e.g., wrapping around) the channel region of the fin. While existing FinFET fabrication techniques have been generally adequate, they have not been entirely satisfactory in all aspects. Therefore, in order to continue to meet ever-increasing design requirements for FinFET devices at increased functional density and decreased geometric sizes, further advances are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a perspective view of a semiconductor structure, constructed in accordance with some embodiments of the present disclosure.

FIG. 1B is a planar top view of the semiconductor structure of FIG. 1A, constructed in accordance with some embodiments of the present disclosure.

FIG. 1C is a cross-sectional view of the semiconductor structure of FIG. 1A taken along the dashed line AA', constructed in accordance with some embodiments of the present disclosure.

FIGS. 4A, 5A, 6A, 7A, 8A, 9A, 11A, 12A, 13A, 14A, and 15A are perspective views of the semiconductor structure at various fabrication stages of a method, constructed in accordance with some embodiments of the present disclosure.

FIGS. 4B, 5B, 6B, 7B, 8B, 9B, 11B, 12B, 13B, 14B, and 15B are top views of the semiconductor structure of FIGS. 4A, 5A, 6A, 7A, 8A, 9A, 11A, 12A, 13A, 14A, and 15A, respectively, constructed in accordance with some embodiments of the present disclosure.

FIG. 10A is a top view of the semiconductor structure at an intermediate fabrication state of a method, constructed in accordance with some embodiments of the present disclosure.

FIGS. 4C, 5C, 6C, 7C, 8C, 9C, 10B, 11C, 12C, 13C, 14C, and 15C are cross-sectional views of the semiconductor structure taken along the dashed line AA' of FIGS. 4A, 5A, 6A, 7A, 8A, 9A, 10A, 11A, 12A, 13A, 14A, and 15A, respectively, constructed in accordance with some embodiments of the present disclosure.

FIGS. 4D, 5D, 6D, 7D, 8D, 9D, 10C, 11D, 12D, 13D, 14D, and 15D are cross-sectional views of the semiconductor structure taken along the dashed line BB' of FIGS. 4A, 5A, 6A, 7A, 8A, 9A, 10A, 11A, 12A, 13A, 14A, and 15A, respectively, constructed in accordance with some embodiments of the present disclosure.

DETAILED DESCRIPTION

Figure 1D:
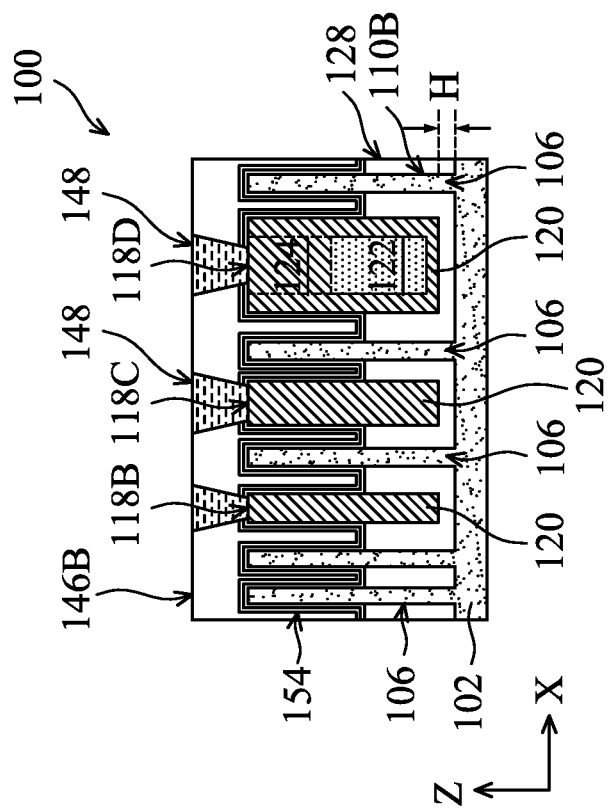
FIG. 1D is a cross-sectional view of the semiconductor structure of FIG. 1A taken along the dashed line BB', constructed in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a fin-like field-effect transistor (FinFET) device. The FinFET device, for example, may be a complementary metal-oxide-semiconductor (CMOS) device including a p-type metal-oxide-semiconductor (PMOS) FinFET device and an n-type metal-oxide-semiconductor (NMOS) FinFET device. The following disclosure will continue with a FinFET example to illustrate various embodiments of the present invention. In particular, the present disclosure may be equally applicable to device FinFET logic devices and FinFET memory devices (e.g., static random-access memory, or SRAM). It is understood, however, that the application should not be limited to a particular type of device, except as specifically claimed.

Figure 1E:
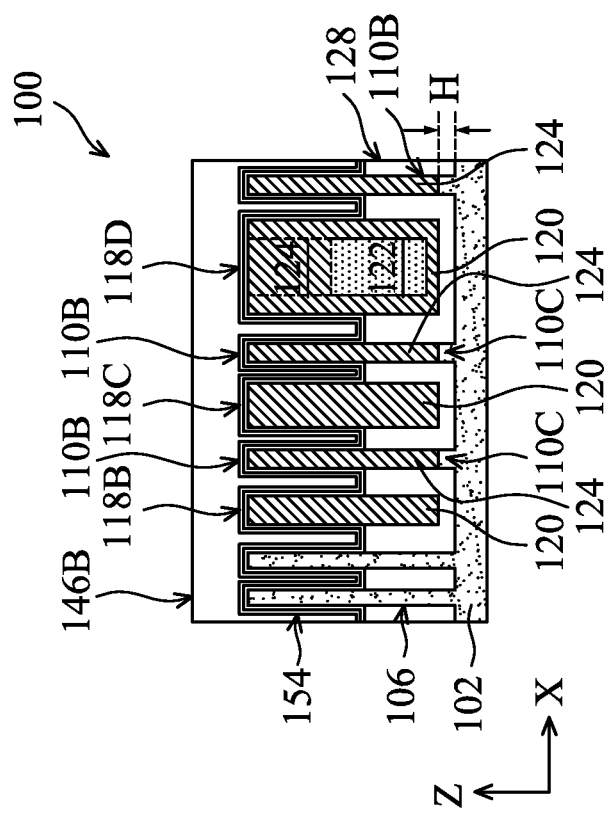
FIG. 1E is a cross-sectional view of the semiconductor structure of FIG. 1A taken along the dashed line CC', constructed in accordance with some embodiments of the present disclosure.

FIG. 1A is a perspective view of a portion of a workpiece 100 according to various aspects of the present disclosure. FIG. 1B is a planar top view of the workpiece 100. FIGS. 1C, 1D, and 1E are cross-sectional views of the workpiece 100 along the dashed lines AA', BB', and CC', respectively, constructed according to various aspects of the present disclosure. FIGS. 1A-1E have been simplified for the sake of clarity and to better illustrate the concepts of the present disclosure. Additional features may be incorporated into the workpiece 100, and some of the features described below may be replaced or eliminated for other embodiments of the workpiece 100.

The workpiece 100 includes a substrate 102. The substrate 102 may include an elementary (single element) semiconductor, such as silicon and/or germanium; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; and/or other suitable semiconductor materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a semiconductor silicon layer formed on a silicon oxide layer.

The workpiece 100 also includes various isolation features 128 and active regions 106 defined by the isolation features 128. The isolation features 128 may include any suitable materials, such as silicon oxide, silicon nitride, silicon oxynitride, fluoride-doped silicate glass (FSG), a low-k dielectric material, and/or other suitable insulating material. The isolation features 128 may be shallow trench isolation (STI) features. Other isolation features such as field oxide, LOCal oxidation of silicon (LOCOS), and/or other suitable features may also be implemented as the isolation features 128. The isolation features 128 may include a multi-layer structure, for example, having one or more thermal oxide liner layers. In the depicted embodiment, the isolation features 128 include an oxygen-containing dielectric material, such as silicon oxide.

In some embodiments, the active regions 106 having a non-planar structure extend upward to above the isolation features 128, which include a dielectric layer 112. The active regions 106 are hereafter referred to as semiconductor fins 106, to be differentiated from dielectric fins 118B-118E and hybrid fins 110 to be introduced below. Multiple semiconductor fins 106 are together referred to as a semiconductor fin structure. While the illustrated embodiments include such a fin structure, further embodiments may include other raised active and passive devices formed upon the substrate 102. The semiconductor fins 106 protrude out of the substrate 102 and extend away from the isolation features 128 along the Z direction. Furthermore, the semiconductor fins 106 are oriented lengthwise along the Y direction and are spaced from each other along the X direction. In the depicted embodiment, the X, Y, and Z directions are orthogonal to each other.

In the present embodiment, referring collectively to FIGS. 1A-1E, the workpiece 100 includes various FETs designed for various functions, such as core devices, memory devices, input/output (I/O) devices, other suitable devices, or combinations thereof. An example FET 152 is illustrated by a dashed circle in FIG. 1A to include various features of the FET, the formation of which will be discussed in detail below. In many embodiments, the FET 152 includes epitaxial source/drain (S/D) features 136, which may include various doped semiconductor materials, a metal gate stack 146 (e.g., one of metal gate stacks 146A-146E), and a channel region 154 (as a portion of the semiconductor fin 106) disposed between the epitaxial S/D features 136 and under the metal gate stack 146. The workpiece 100 may include multiple metal gate stacks 146 oriented lengthwise along the X direction and spaced from each other along the Y direction. Each metal gate stack 146 may include one or more gate cut feature 148 configured to isolate adjacent gate structures to form individual FETs. The workpiece 100 may further include S/D contact features 150 disposed over the epitaxial S/D features 136. Various features (e.g. FETs 152) of the workpiece 100 are separated by an etch-stop layer (e.g., an etch-stop layer) 142 and an interlayer dielectric (ILD) layer 140.

The workpiece 100 further includes dielectric fins 118B-118E, or collectively referred to as a dielectric fin structure 118. Similar to the semiconductor fins 106, the dielectric fin structure 118 extend away from the isolation features 128 along the direction Z, though they are dielectric (e.g., insulating or inactive) features disposed between the semiconductor fins 106. The dielectric fin structure 118 of the present disclosure have various dimensions and orientations. For example, the dielectric fins 118B-118D oriented lengthwise along the Y direction (i.e., substantially parallel to the orientation of the semiconductor fins 106) have different widths. As depicted herein, a width $W_1$ of the dielectric fin 118B is less than a width $W_2$ of the dielectric fin 118C, which is less than a width $W_3$ of the dielectric fin 118D. In some embodiments, a ratio of $W_3$ to $W_2$ is from about 1 to about 4. In some embodiments, $W_1$ is similar to a width $W_f$ of the semiconductor fin 106. The dielectric fin structure 118 may also include a dielectric fin 118E oriented lengthwise along the X direction (i.e., substantially orthogonal to the dielectric fins 118B-118D) that is substantially similar in width as the dielectric fin 118D. In some examples, $W_f$ and $W_1$ may be from about 5 nm to about 15 nm, $W_2$ may be from about 20 nm to about 50 nm, and $W_3$ may be from about 50 nm to about 200 nm. Of course, other dimensions of the semiconductor fin 106 and the dielectric fins 118B-118D may also be applicable in the present disclosure.

The dielectric fins 118B-118E, with their respective dimensions and locations, are configured to support the overall structure of the workpiece 100 in many aspects. Due to various design and processing parameters, the density of the semiconductor fins 106 formed over the substrate 102 may not be uniform, i.e., some portions of the workpiece 100 may include a greater density of semiconductor fins 106 than other portions. Furthermore, many semiconductor fins 106 may be truncated during fabrication, further altering the density of the semiconductor fins 106 in some portions of the workpiece 100. As a result, when gate structures (e.g., dummy gate stacks 130A-130E to be described in detail below) are subsequently formed over the semiconductor fins 106, those portions of the workpiece 100 having a lower density of the semiconductor fins 106 may not provide sufficient structural support for the gate structures, leading to collapse or bending of the gate structures. Additionally, during a cut metal gate (CMG) process performed on replaced metal gate stacks (e.g., metal gate stacks 146A-146E) to form gate cut features 148, damage to the workpiece 100 may occur as a result of unintentional lateral over-etching of two neighboring semiconductor fins 106 in close proximity. For at least these reasons, the present disclosure provides embodiments in which the dielectric fins 118B-118E are configured to at least provide structural support for subsequently formed gate structures (e.g., dummy gate stacks 130A-130E) in areas where semiconductor fins 106 are absent (referring to the dielectric fins 118B-118D depicted in FIGS. 1A-1E), tune the overall fin density, enlarge the processing window for forming the gate cut features 148 (referring to the gate cut features 148 formed over the dielectric fins 118-118D as depicted in FIG. 1E), and enhance the mechanical strength of the semiconductor fins 106.

The dielectric fins 118B-118E may include a single dielectric material layer, such as dielectric material layer 120 (e.g., the dielectric fins 118B and 118C), or multiple dielectric material layers, such as dielectric material layers 120, 122, and/or 124 (e.g., the dielectric fins 118D and 118E). In the depicted embodiment, the narrower dielectric fins 118B and 118C may include a single dielectric material layer, such as the dielectric material layer 120. In furtherance to the depicted embodiment, the wider dielectric fins 118D and 118E may include multiple dielectric material layers, where the dielectric material layer 124 is disposed over the dielectric material layer 122, which is disposed over the dielectric material layer 120. In the depicted embodiment, the dielectric material layer 120 wraps around the dielectric material layers 122 and 124. In other words, sidewalls of the dielectric material layer 120 are in direct contact with sidewalls of both the dielectric material layers 122 and 124. Notably, referring to FIGS. 1C and 1D, a width $W_4$ of the dielectric material layer 122 is similar to or substantially the same as a width $W_5$ of the dielectric material layer 124 and less than $W_3$. Stated another way, $W_4$ and $W_5$ both span from one sidewall of the dielectric material layer 120 to another. In some embodiments, a ratio of $W_4$ (or $W_5$) to $W_3$ is from about 0.6 to about 0.9. In some examples, $W_4$ and $W_5$ may be from about 30 nm to about 180 nm, and $W_3$ may be from about 50 nm to about 200 nm. Further, the dielectric material layer 120 is configured to contact a bottom surface of the dielectric material layer 122 and sidewalls of the dielectric material layers 122 and 124.

In many embodiments, the dielectric material layer 120 is similar to the dielectric material layer 124 in composition and may both include a nitrogen-containing dielectric material, such as silicon nitride, a metal-containing nitride, other suitable materials, or combinations thereof. In some examples, a difference in the composition of nitrogen between the dielectric material layer 120 and the dielectric material layer 124 is no more than about 2% (atomic percent). The dielectric material layer 122 is different from the dielectric material layers 120 and/or 124 in composition and may include an oxygen-containing dielectric material, such as silicon oxide, silicon oxycarbide, silicon carbon oxynitride, other suitable materials, or combinations thereof. Notably, the dielectric material layer 122 is similar to the dielectric layer 112 (i.e., isolation features 128) in composition as they both include an oxygen-containing dielectric material. In some examples, a difference in the composition of oxygen between the dielectric material layer 122 and the dielectric layer 112 is no more than about 2% (atomic percent). Furthermore, as will be discussed in detail below, methods of forming the dielectric material layers 120, 122, and 124 may differ as well. By using multiple dielectric material layers to form the dielectric fins 118D and 118E, the processing capability is increased. For example, after the filling of the dielectric material layer 120, the aspect ratios of the trenches are reduced, making them easier to be filled with a subsequent dielectric material layer (e.g., the dielectric material layer 122). As a result, the processing window of forming the dielectric fins 118D and 118E is enhanced, the detail of which will be further explained below. Furthermore, by including different dielectric materials, etching selectivity between the dielectric fins and the isolation features 128 may be enhanced, improving the processing capability.

The dielectric fins 118B-118E may be formed by any suitable method, such as atomic layer deposition (ALD), chemical vapor deposition (CVD), flowable CVD (FCVD), spin-on coating, physical vapor deposition (PVD), other suitable methods, or combinations thereof. In the depicted embodiment, the dielectric material layers 120 and 124 are formed by an ALD process, while the dielectric material layer 122 is formed by an FCVD and/or a spin-on coating process. The fabrication of the dielectric fin structure 118 will be discussed in detail below.

The workpiece 100 further includes hybrid fins 110 that each includes a semiconductor portion 110A as depicted in FIG. 1C and a dielectric portion 110B as depicted in FIG. 1D. The semiconductor portion 110A and the dielectric portion 110B are oriented along the direction Y (i.e., substantially parallel to the semiconductor fins 106 and the dielectric fins 118B-118D), such that sidewalls of the semiconductor portion 110A and sidewalls of the dielectric portion 110B are continuous along the direction Y. In some embodiments, sidewalls of the semiconductor portion 110A are coplanar with sidewalls of the dielectric portion 110B along the direction Y. In many embodiments, the dielectric portion 110B is disposed under the metal gate stack 146 (e.g., 146B as depicted in FIG. 1A). The semiconductor portion 110A is similar to the semiconductor fins 106 in composition, while the dielectric portion 110B includes the dielectric material layer 124. In the depicted embodiment, another semiconductor portion 110C having a height H is disposed under the dielectric portion 110B along the Z direction. In other words, a bottom surface of the dielectric portion 110B is in contact with a top surface of the semiconductor portion 110C. In further embodiments, the bottom surface of the dielectric portion 110B is below a bottom surface of the dielectric fins 118B-118D. In one example, H is greater than 0 and may be less than about 20% a height of the hybrid fins 110. In other embodiments, the semiconductor portion 110C is omitted from the workpiece 100, such that the bottom surface of the dielectric portion 110B is in direct contact with a top surface of the substrate 102. In contrast, bottom surface of the dielectric fins 118B-118D are separated from the substrate 102 by the isolation features 128.

When forming gate structures (e.g., dummy gate stacks 130A-130E), misalignment between the gate structures and the semiconductor may cause structural defects (e.g., voids) to form in the semiconductor fin, especially during subsequent processes of forming sour/drain features. In some embodiments of the present disclosure, replacing a portion of the semiconductor fin with a dielectric material in a region where the gate structures are to be formed helps mitigate any potential structural defects introduced by the misalignment between the gate structures and the semiconductor fins. The dielectric portion 110B of the hybrid fins 110 as discussed above is configured to mitigate the potential effects of misalignment in gate structures.

Figure 2A:
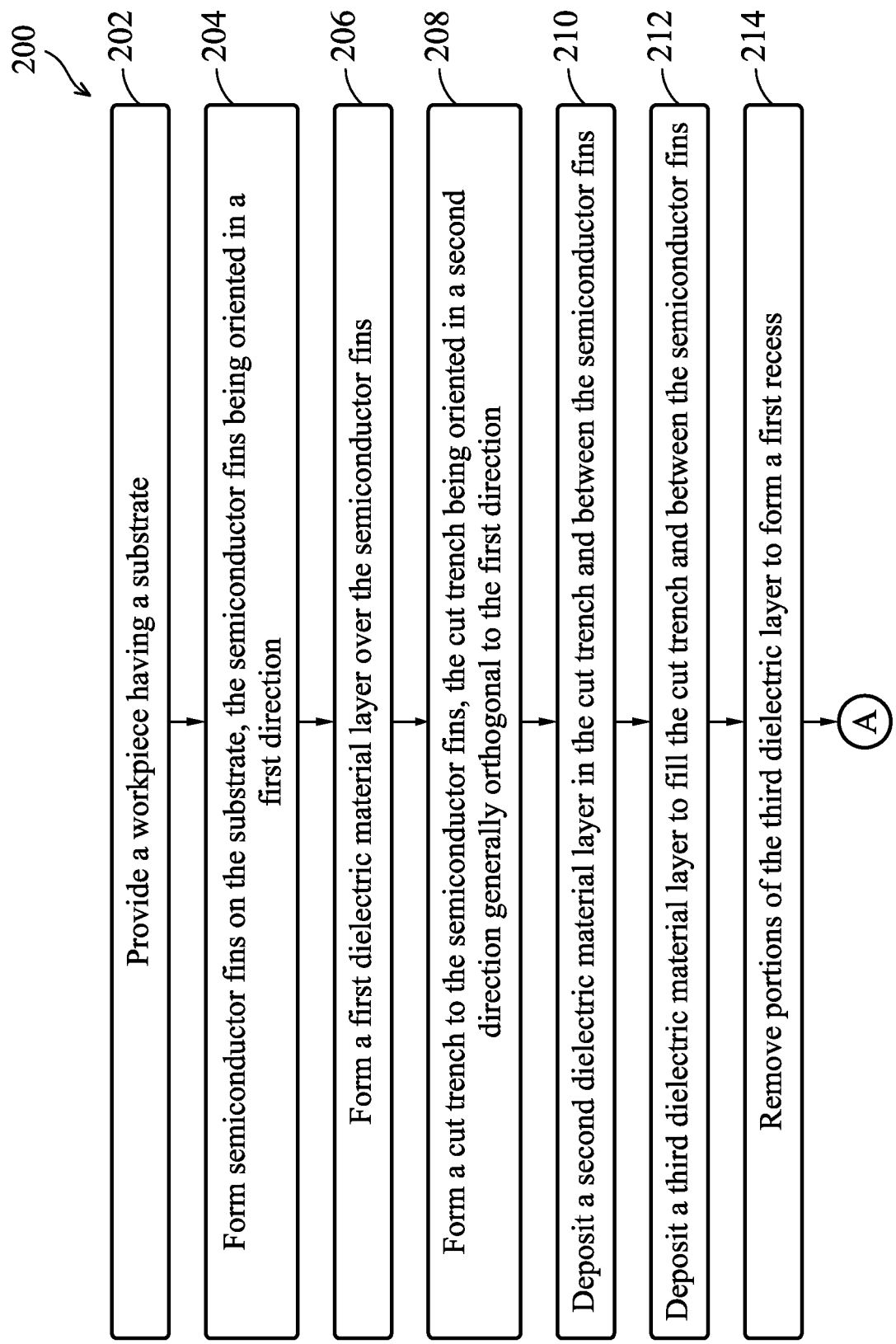
FIGS. 2A and 2B illustrate a flowchart of an integrated circuit fabrication method in accordance with some embodiments of the present disclosure.
Figure 2B:
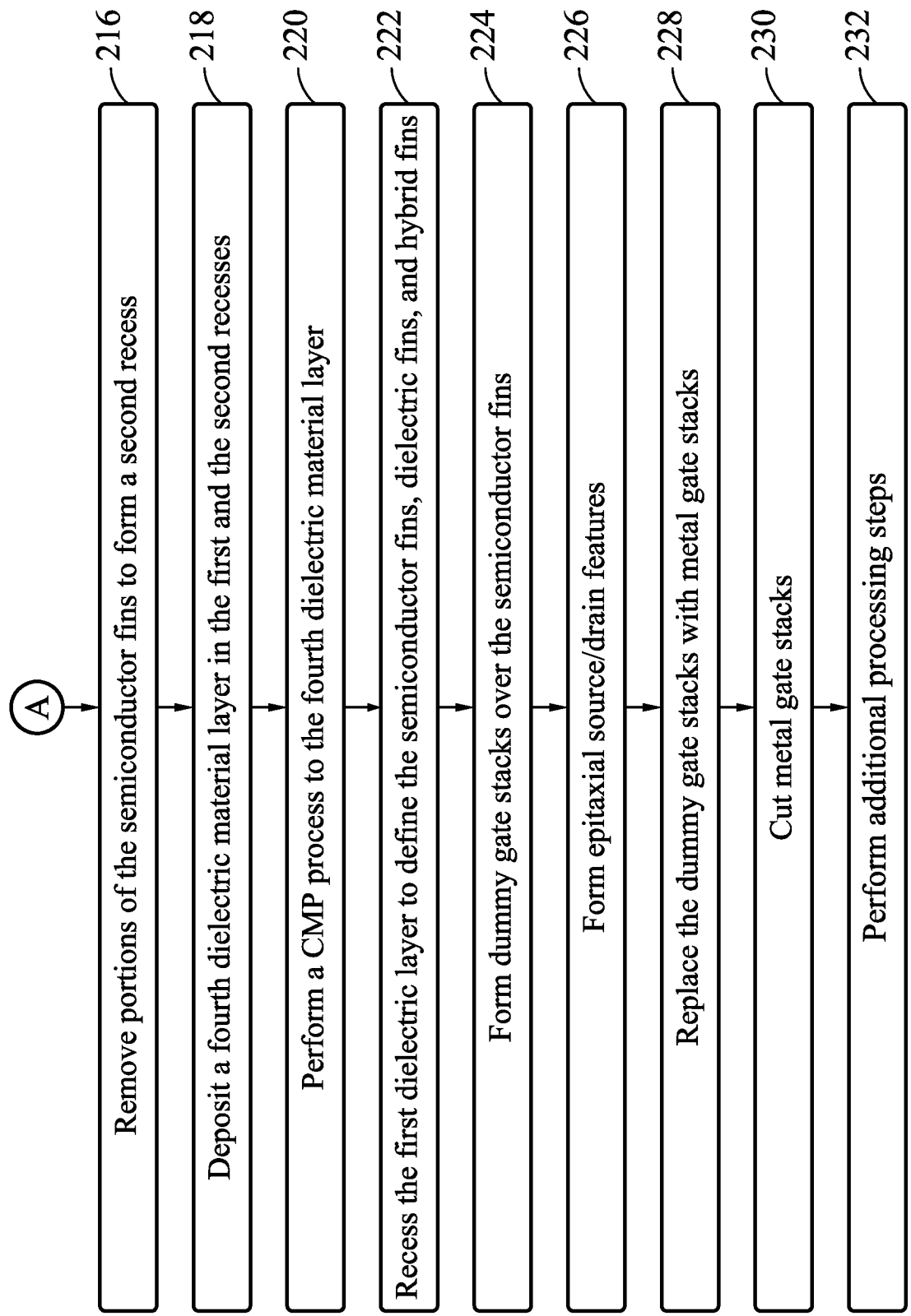

Methods of forming the workpiece 100 having FETs 152 will now be described with reference to FIGS. 2A-15D. FIGS. 2A-2B illustrate a flowchart of a method 200 for fabricating the workpiece 100 according to various aspects of the present disclosure. The figures that follow refer perspective views, top views, and cross-sectional views of the workpiece 100 taken through the source/drain regions (e.g., along the dashed line AA') or through the metal gate stacks 146 (e.g., along the dashed line BB') of the workpiece 100.

The method 200 and the structure of the workpiece 100 are collectively described according to various aspects of the present disclosure. It is understood that additional steps can be provided before, during, and after the method 200 and that some of the steps described can be replaced or eliminated for other embodiments of the method. In the following description, the active regions are also referred to as semiconductor fins 106.

Figure 3:
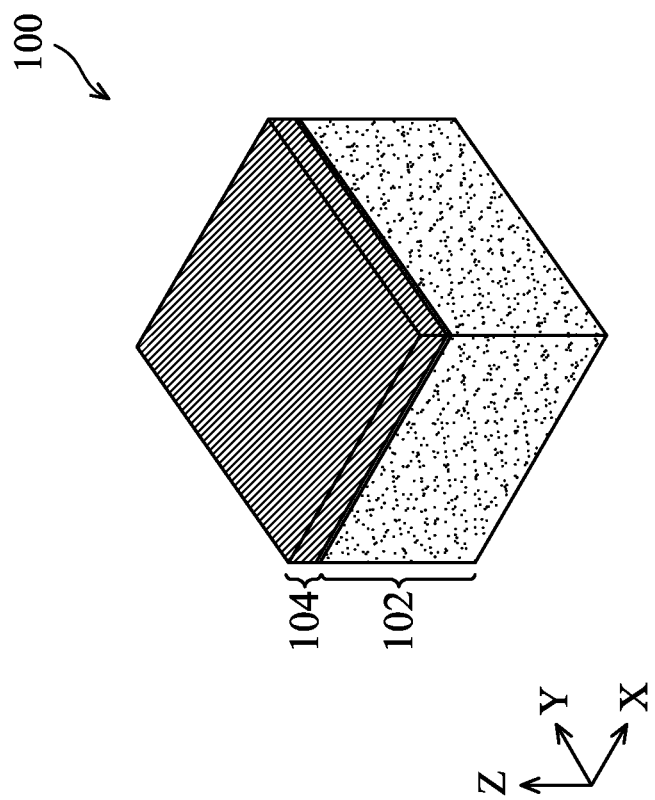
FIG. 3 is a perspective view of a semiconductor structure, constructed in accordance with some embodiments of the present disclosure.

Referring to FIG. 2A and to FIG. 3, the method 200 at operation 202 provides (or is provided with) a workpiece 100, which includes a substrate 102 as described in detail above. The substrate 102 may be uniform in composition or may include various layers. The layers may have similar or different compositions, and in various embodiments, some substrate layers have non-uniform compositions to induce device strain and thereby tune device performance. Examples of layered substrates include silicon-on-insulator (SOI) substrates. In some such examples, the substrate 102 may include an embedded insulating layer such as a silicon oxide, a silicon nitride, a silicon oxynitride, or other suitable insulating materials.

The substrate 102 may have one or more layers formed upon it. For example, the substrate 102 includes one or more semiconductor layer epitaxially grown on bulk silicon, such as a silicon wafer. For example, the substrate 102 includes a first semiconductor layer formed on bulk silicon and a second semiconductor layer formed on the first semiconductor layer. The first semiconductor layer includes a first semiconductor material (such as SiGe) and the second semiconductor layer includes a second semiconductor material (such as Si) different from the first semiconductor material. The first and second semiconductor layers are epitaxially grown by suitable techniques, such as selective epitaxy growth (SEG). In some embodiments, suitable deposition processes for epitaxy growth include atomic layer deposition (ALD), chemical vapor deposition (CVD), physical vapor deposition (PVD), high-density plasma CVD (HDP-CVD), and/or other suitable deposition processes. Any of these techniques may be used to grow the semiconductor layer having any composition including a graded composition. In some embodiments, the substrate 102 may be doped by a proper method, such as ion implantation.

To facilitate fabrication and to avoid damage to the semiconductor layer, one or more hard mask layer 104 may be formed on the substrate 102. For example, the hard mask layer 104 may include a dielectric such as semiconductor oxide, semiconductor nitride, semiconductor oxynitride, or semiconductor carbide. In some examples, the hard mask layer 104 includes two or more films stacked together, such as a silicon oxide film and a silicon nitride film in stack. The hard mask layer 104 may be formed by thermal growth, ALD, CVD, HDP-CVD, PVD, and/or other suitable deposition processes. The hard mask may include other suitable material, such as a silicon oxide layer and a poly-silicon layer on the silicon oxide layer.

Referring to FIG. 2A and to FIGS. 4A-4D, the method 200 at operation 204 patterns the substrate 102 to form one or more semiconductor fins 106 extending away from the substrate 102. In some embodiments, the operation 204 includes one or more lithography and etching processes. In further embodiments, the operation 204 includes forming a patterned resist layer (e.g., photoresist layer; not depicted) and forming a fin structure that includes one or more semiconductor fins 106 separated by trenches 108 using the patterned resist layer as an etch mask. In the present embodiment, the openings in the patterned resist layer are first transferred to the hard mask layer 104 by an etching process and then transferred to the substrate 102 by one or more subsequent etching process. More details of the operation 204 are further provided below.

The resist layer used to form the semiconductor fins 106 may be formed on the hard mask layer 104. An example resist layer includes a photosensitive material that undergoes a property change when exposed to light, such as ultraviolet (UV) light, deep UV (DUV) light or extreme UV (EUV) light. This property change can be used to selectively remove exposed or unexposed portions of the resist layer by a developing process. This procedure to form a patterned resist layer is also referred to as a lithographic patterning or lithography process.

In one embodiment, the resist layer is patterned to leave the portions of the photoresist material disposed over the workpiece 100 by the lithography process. After patterning the resist, an etching process is performed on the workpiece 100 to open the hard mask layer 104, thereby transferring the pattern from the resist layer to the hard mask layer 104. The remaining resist layer may be removed after the patterning the hard mask layer 104. An exemplary lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing. The etching process to pattern the hard mask layer may include wet etching, dry etching or a combination thereof. The first etching process applied to the hard mask layer 104 may include multiple etching steps. For example, the silicon oxide film in the hard mask layer may be etched by a diluted hydrofluorine solution and the silicon nitride film in the hard mask layer may be etched by a phosphoric acid solution. The second etching process applied to the substrate 102 may include any suitable etching technique such as dry etching, wet etching, other etching methods (e.g., reactive ion etching (RIE)), or a combination thereof. In some examples, the second etching process may include multiple etching steps with different etching chemistries, each targeting a particular material of the workpiece 100. In some examples, the semiconductor material of the substrate 102 may be etched by a dry etching process using a fluorine-based etchant. In some embodiments, etching includes multiple etching steps with different etching chemistries, each targeting a particular material of the substrate 102 and each selected to resist etching the hard mask layer 104. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The remaining portions of the semiconductor layers become the semiconductor fins 106, defining the trenches 108 (e.g., trenches 108B-108D) between the semiconductor fins 106.

Numerous other embodiments of methods to form the semiconductor fins 106 may be suitable. For example, the semiconductor fins 106 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 106.

Figure 4C:
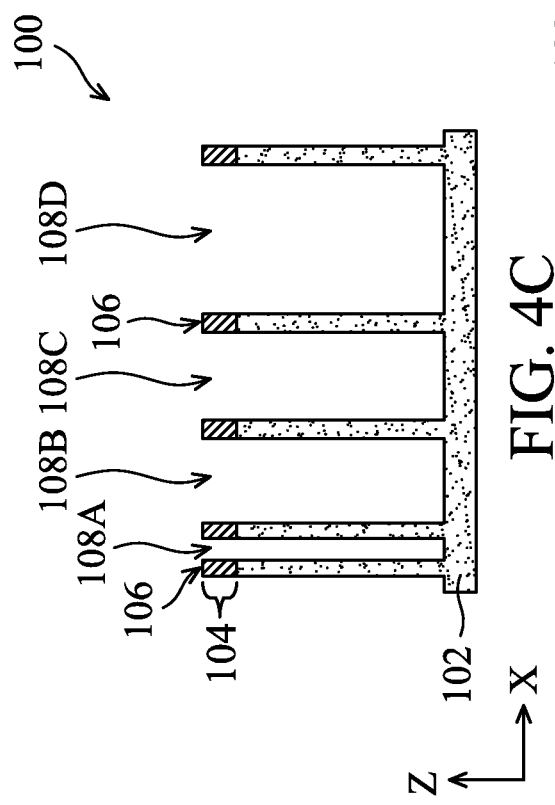
Figure 4D:
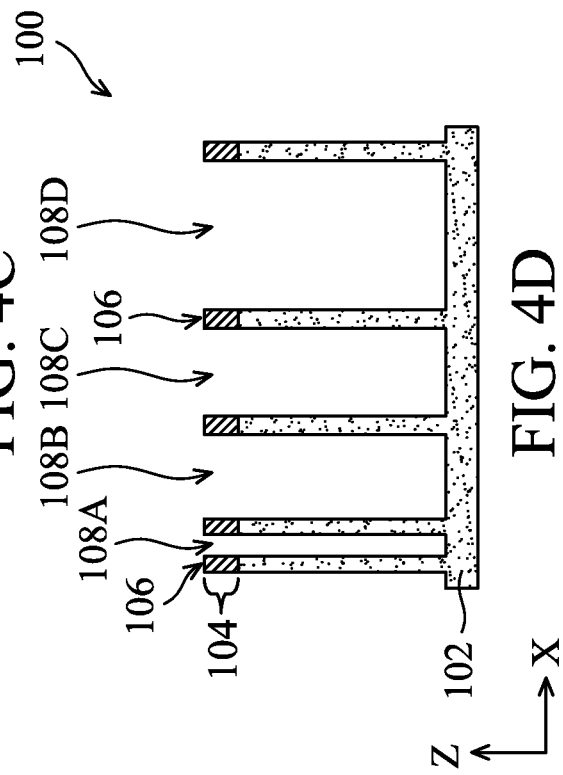
Figure 4A:
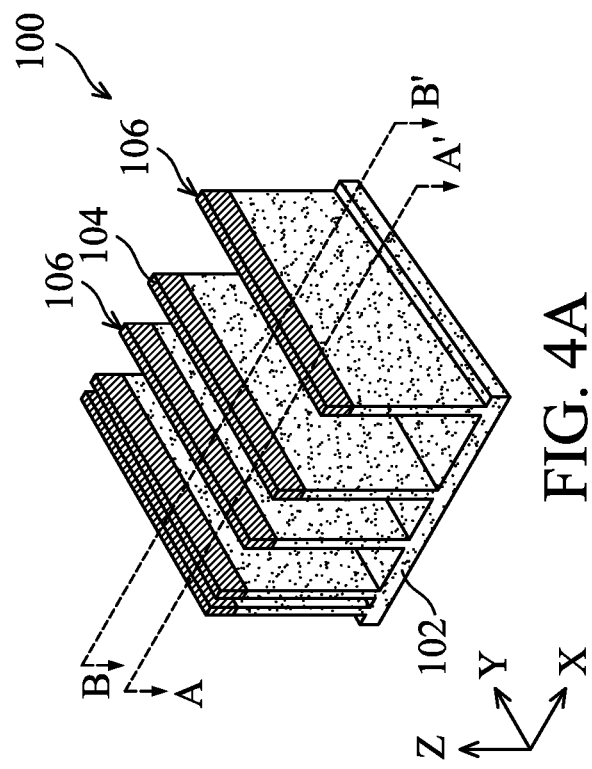
Figure 4B:
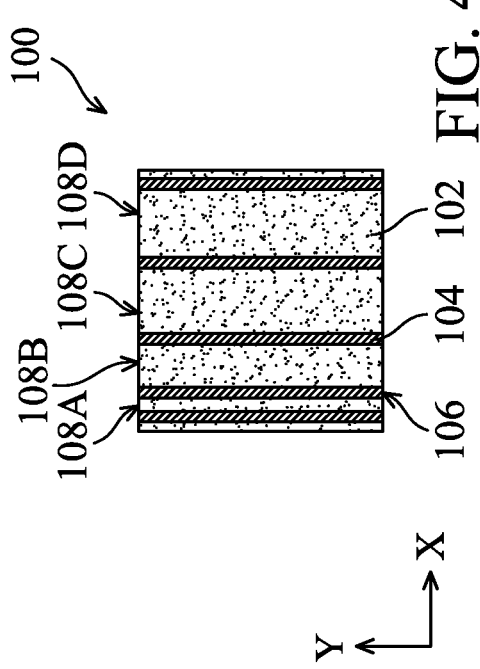
Figure 6C:
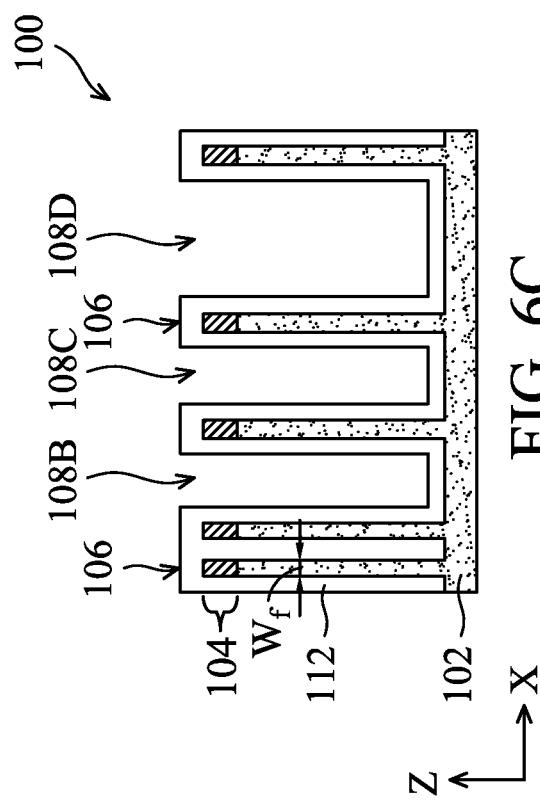
Figure 6D:
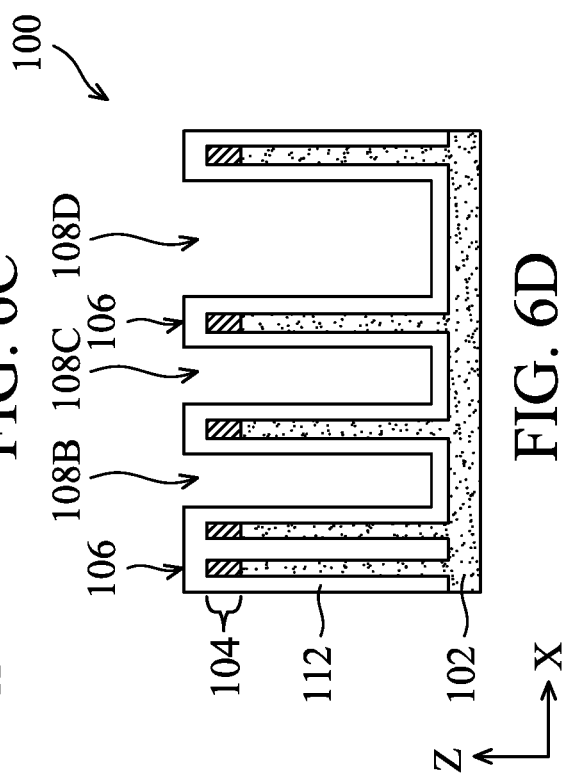
Figure 6A:
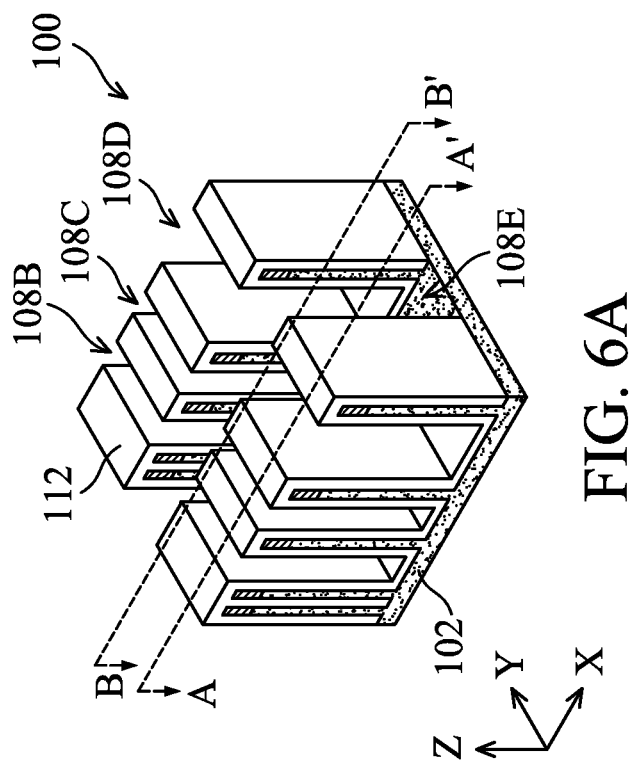
Figure 6B:
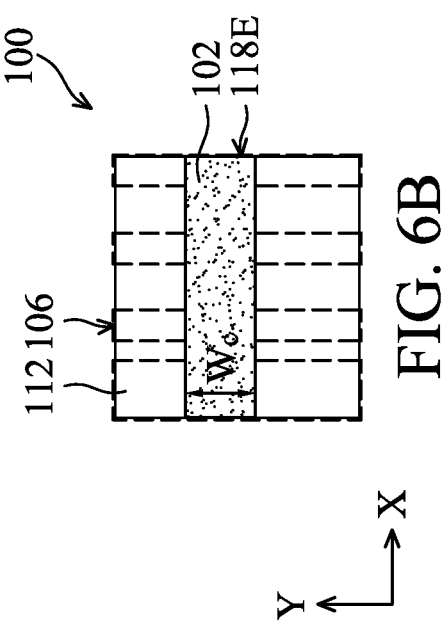

The patterning (e.g., lithography and etching) processes are configured to produce semiconductor fins 106 of any suitable height and width extending from the substrate 102. Particularly, the etching process applied to the substrate 102 is controlled such that the substrate 102 is partially etched, as illustrated in FIG. 4A. This may be achieved by controlling etching time or by controlling other etching parameter(s). By the etching processes, the semiconductor fins 106 are formed to extend away from the substrate 102. The workpiece 100 includes a fin structure of multiple semiconductor fins 106 oriented lengthwise in the Y direction. In addition to forming the semiconductor fins 106, the patterning process also defines one or more trenches 108A, 108B, 108C, and 108D (or collectively referred to as the trenches 108) between the semiconductor fins 106. As discussed above, the semiconductor fins 106 each include one or more semiconductor material the same as or different form that of the substrate 102. For example, the semiconductor fins 106 each include silicon, germanium, silicon germanium, or other suitable semiconductor material. In other examples, the semiconductor fins 106 include silicon germanium with a graded concentration, such as the germanium concentration increasing toward the top surface of the semiconductor fins.

Referring to FIG. 2A and to FIGS. 5A-5D, the method 200 at operation 206 proceeds to form the dielectric layer 112 on the substrate 102. In the present embodiment, the dielectric layer 112 is deposited on the substrate 102 with a conformal profile, covering the substrate 102 and over sidewalls and top surfaces of the semiconductor fins 106. The dielectric layer 112 may include a single dielectric material layer or multiple dielectric material layers. Suitable dielectric materials for the dielectric layer 112 include silicon oxides, silicon nitrides, silicon carbides, FSG, low-k dielectric materials, field oxide, LOCOS, other suitable dielectric materials, or a combination thereof. The dielectric material may be deposited by any suitable technique including thermal growth, ALD, CVD, HDP-CVD, PVD, and/or spin-on techniques. In the illustrated embodiment, an ALD process is used as the conformal deposition technique for forming the dielectric layer 112. The dielectric layer 112 constitutes, at least partially, isolation features 128 as discussed with reference to FIGS. 1A-1D, such as a shallow trench isolation feature (STI).

As will be shown below at a later stage of the method 200, the dielectric fins 118B-118D will be formed in at least some of the trenches (e.g., in the trenches 108B, 108C, and 108D, etc.). In contrast, some trenches between the semiconductor fins 106 with relatively narrower spacing (e.g., less than about 2 nm) may be filled up by the dielectric layer 112, such as the trench 108A, and thus no dielectric fin is formed in these trenches. In the depicted embodiment, some trenches may have a width substantially similar to a width $W_f$ of the semiconductor fin 106, such as the trench 108B. Some trenches between semiconductor fins 106 with relatively wider spacing may have gaps larger than $W_f$, such as the trenches 108C or 108D.

Referring to FIG. 2A and to FIGS. 6A-6D, the method 200 at operation 208 proceeds to form a course cut (or cut trench) 108E to the semiconductor fins 106 by one or more lithography and etching processes. The cut trench 108E is a trench cut through the semiconductor fins 106, defining ends of the semiconductor fins 106. The cut trench 108E extends through multiple semiconductor fins 106 along the X direction. The lithography and etching processes implemented at the operation 208 are similar to those implemented at the operation 204. Particularly, a patterned resist layer (not depicted) is formed by a lithography patterning process, and an etching process is applied to the semiconductor fins 106 and the dielectric layer 112 to form the cut trench 108E using the patterned resist layer as an etch mask. The cut trench 108E's width $W_c$ is substantially greater than the width $W_f$ of the semiconductor fins 106. In some embodiments, the width $W_c$ may be different from the widths of other trenches (e.g., 108B-108D) because it is defined by a separate patterning process at operation 208 and is configured for different design criteria (e.g., enough spacing between adjacent fin ends and/or mitigates unintentional over-etching of the semiconductor fins 106 during a CMG process as discussed above). After the formation of the cut trench 108E, the patterned resist layer is removed by wet stripping or plasma ashing. In some embodiments, the cut trench 108E may be omitted from the workpiece 100.

Referring to FIG. 2A and to FIGS. 7A-7D, the method 200 proceeds at operation 210 to fill or partially fill the trenches 108 between the semiconductor fins 106 with the dielectric material layer 120. In many embodiments, the dielectric material layer 120 includes a nitride-containing material, such as silicon nitride or a metal nitride (e.g., aluminum nitride), other suitable dielectric materials, or combinations thereof. In the depicted embodiment, the trenches 108B and 108C are completely filled with the dielectric material layer 120 to form dielectric fins 118B and 118C, respectively, while the trenches 108D and 108E are partially filled with the dielectric material layer 120. As discussed above, the trenches 108 have varying dimensions.

The dielectric material layer 120 may be deposited conformally in the trenches 108 by any suitable method such as ALD, CVD, PVD, other suitable methods, or combinations thereof. In the depicted embodiment, the dielectric material layer 120 is formed by an ALD process. As described in detail below, the trenches 108D and 108E further include additional dielectric material layers.

Referring to FIG. 2A and to FIGS. 8A-8D, the method 200 at operation 212 completely fills the trenches 108D and 108E with the dielectric material layer 122 to form the dielectric fins 118D and 118E, respectively. The dielectric material layer 122 is different from the dielectric material layer 120 in composition. For examples, the dielectric material layer 120 includes a nitride-containing dielectric material, while the dielectric material layer 122 includes an oxide-containing dielectric material, such as silicon oxide, silicon oxycarbide, silicon carbon oxynitride, metal oxide (e.g., aluminum oxide), other dielectric materials, or combinations thereof. The dielectric material layer 122 may be deposited by flowable CVD (FCVD) or spin-on deposition rather than ALD, because FCVD (or spin-on deposition) offers more efficient filling of the trenches 108D and 108E with an oxide-containing material compared to the ALD process used to deposit the dielectric material layer 120.

Thereafter, still referring to FIG. 2A and FIGS. 8A-8D, the method 200 at operation 212 proceeds to perform a polishing process, such as a chemical mechanic polishing (CMP) process, to planarize a top surface of the workpiece 100 and to remove any excessive portions of the dielectric material layer 122. In some embodiments, the hard mask layer 104 may function as a CMP stop layer. In some embodiments, the hard mask layer 104 may be removed by the CMP process or an additional etching process. In the depicted embodiment, the CMP process stops above the hard mask layer 104, such that a portion of the dielectric material layer 122 remains over the hard mask layer 104.

Referring to FIG. 2A and to FIGS. 9A-9D, the method 200 at operation 214 removes portions of the dielectric material layer 122 to form a recess 125 in the dielectric fins 118D and 118E. In other words, the dielectric fins 118D and 118E are partially recessed at operation 214 by an etching process. The etching process may be a dry etching process, a wet etching process, an RIE process, other etching processes, or combinations thereof. In an example embodiment, the etching process is a dry etching process implementing one or more fluorine-containing or chlorine-containing gas. In the depicted embodiment, because the dielectric material layer 120 and the dielectric material layer 122 differ in composition, the method 200 may remove the portions of the dielectric material layer 122 by, for example, a selective etching process. The etching process may be tuned to remove the dielectric material layer 122 at a greater rate than the dielectric material layer 120, such that a top surface of the dielectric material layer 122 is below a top surface of the dielectric material layer 120 after the method 200 performs the operation 214. In one example, about 30% of the dielectric material layer 122 may be removed by the etching process at operation 214.

Referring to FIG. 2B and to FIGS. 10A-10C, the method 200 at operation 216 removes portions of at least one semiconductor fin 106 along the Y direction to form a recess 127. In the depicted embodiment, portions of three semiconductor fins 106 are removed by one or more lithography and etching processes similar to those described in reference to operation 204. For example, a patterned resist layer (not depicted) may be formed over the workpiece 100, exposing the portions of the semiconductor fins 106 to a subsequent etching process that removes portions of the semiconductor fin 106 along the Y direction to form the recess 127. Thereafter, the patterned resist layer is removed by any suitable method, such as resist stripping or plasma ashing, to expose the dielectric material layer 120 and partially recessed dielectric material layer 122 to subsequent processing steps.

In the depicted embodiment, referring to FIGS. 10A and 10C, the semiconductor fins 106 are partially recessed, such that portions of the semiconductor fins 106 remain over the substrate 102 to form the semiconductor portions 110C of the hybrid fins 110. In an example embodiment, a top surface of the semiconductor portions 110C is at a similar level or below a bottom surface of the dielectric material layer 120. In an alternative embodiment, the semiconductor fins 106 in the recess 127 are completely removed from the workpiece 100 (i.e., the semiconductor portions 110C are omitted from the workpiece 100), exposing the substrate 102.

Though not depicted, in some embodiments, prior to performing the lithography and etching processes, the method 200 removes the portion of the dielectric material layer 120 and the dielectric layer 112 formed over the top surface of the hard mask layer 104. To do so, the method 200 may first deposit a filler material (e.g., a resist material) over the recessed dielectric material layer 122 to completely fill the recess 125 and then performs a CMP process to remove the filler material, the dielectric material layer 120, and the dielectric layer 112 from the top surface of the semiconductor fins 106, thereby exposing the hard mask layer 104. Thereafter, remaining filler material is removed by any suitable method, such as resist stripping or plasma ashing, and the method 200 proceeds to performing the one or more lithography and etching processes to remove portions of the semiconductor fins 106 along the Y direction as discussed above.

Referring to FIG. 2B and to FIGS. 11A-11D, the method 200 at operation 218 deposits another dielectric material layer 124 over the workpiece 100, thereby completely filling both recesses 125 and 127 to form the dielectric fins 118D and 118E. The dielectric material layer 124 may be formed by any suitable method, such as ALD, CVD, PVD, other suitable methods, or combinations thereof. In the depicted embodiment, the dielectric material layer 124 is deposited by an ALD process. In the depicted embodiment, the dielectric material layer 124 (i.e., the dielectric portion 110B) is formed over the top surface of the semiconductor portion 110C. In furtherance to the depicted embodiment, the dielectric material layer 120 forms a U-shaped layer in the dielectric fins 118D and 118E, while the dielectric material layers 122 and 124 fill the space within the U-shaped dielectric material layer 120. In other words, the dielectric fins 118D and 118E includes three dielectric material layers, namely, the dielectric material layer 120, 122, and 124, where the sidewalls of the dielectric material layer 120 are in contact with the sidewalls of both of the dielectric material layers 122 and 124. In comparison, due to their smaller dimensions, the dielectric fins 118B and 118C include only one dielectric material layer, namely, the dielectric material layer 120.

Compositionally, the dielectric material layer 124 is different from the dielectric material layer 122 and the dielectric layer 112 but similar to the dielectric material 120 as discussed above. For example, the dielectric material layers 120 and 124 may both include a nitrogen-containing dielectric material, such as silicon nitride, a metal-containing nitride, other suitable materials, or combinations thereof, while the dielectric material layer 122 includes an oxygen-containing dielectric material, such as silicon oxide, silicon oxycarbide, silicon carbon oxynitride, other suitable materials, or combinations thereof. Differences in composition between the dielectric material layer 124 and the dielectric layer 112 enhances etching selectivity between the two material layers at a subsequent processing step.

Thereafter, still referring to FIGS. 11A-11D, the method 200 forms a dielectric layer 129 over the top surface of the workpiece 100. In some embodiments, the dielectric layer 129 is configured to accommodate the subsequent CMP process as discussed below. The dielectric layer 129 may include a plasma-enhanced oxide (PEOX), plasma-enhanced SiN (PE-SiN), undoped silicate glass (USG), plasma-enhanced USG (PE-USG), other suitable materials, or combinations thereof, and may be formed by any suitable method such as plasma-enhanced CVD (PECVD), FCVD, other suitable methods, or combinations thereof. In many embodiments, the dielectric layer 129 includes a composition different from that of the dielectric material layer 124 and the dielectric layer 112.

Referring to FIG. 2B and to FIGS. 12A-12D, the method 200 at operation 220 performs a CMP process to remove the dielectric layer 129, portions of the dielectric material layer 124, portions of the dielectric layer 112, and the hard mask layer 104 to expose the top surface of the semiconductor fins 106. Referring to FIGS. 12C and 12D, by planarizing the top surface of the semiconductor fins 106, the method 200 at operation 220 replaces portions of the semiconductor fins 106 with dielectric fins, thereby forming hybrid fins 110 having the semiconductor portion 110A and the dielectric portion 110B arranged adjacent to each other along the Y direction. As such, sidewalls of the semiconductor portion 110A and the dielectric portion 110B are substantially continuous along the Y direction.

Referring to FIG. 2B and FIGS. 13A-13D, the method 200 at operation 222 selectively recesses the dielectric layer 112 to form isolation features 128. After the dielectric layer 112 is recessed, the semiconductor fins 106, the dielectric fin structure 118, and the hybrid fins 110 extend above the recessed dielectric layer 112. The semiconductor fins 106 are electrically isolated from each other by the recessed dielectric layer 112 (i.e., the isolation features 128). Any suitable etching technique may be used to recess the dielectric layer 112, including dry etching, wet etching, RIE, and/or other etching methods. In an example embodiment, an anisotropic dry etching is used to selectively remove the dielectric layer 112 at a greater rate than does the semiconductor fins 106, the dielectric material layer 124, and the dielectric material layer 120 using a proper etchant gas, such as one or more fluorine-containing or chlorine-containing gas. The height of the semiconductor fins 106 are determined by the etching depth of the etching process used to recess the dielectric layer 112. The etching depth may be determined by many factors such as, for example, etching time, etching bias, etching power, other factors, or combinations thereof.

Referring to FIG. 2B and FIGS. 14A-14D, the method 200 at operation 224 forms dummy gate stacks 130A-130E (collectively referred to as dummy gate stacks 130). In the present embodiment, portions of the dummy gate stacks 130 will be replaced by metal gate stacks at a later fabrication stage. The dummy gate stacks 130 are formed over portions of the semiconductor fins 106, the dielectric fins 118B-118D, and the hybrid fins 110. In some examples, the formation of the dummy gate stacks 130 includes depositing a gate dielectric layer 126 over the semiconductor fins 106 and the dielectric fins 118B-118D, depositing a dummy gate electrode layer 131 containing polysilicon or other suitable material over portions of the gate dielectric layer 126, and subsequently patterning the dummy gate electrode layer 131. In some embodiments, the gate dielectric layer 126 includes silicon oxide deposited conformally by a suitable method, such as ALD, CVD, thermal oxidation, chemical oxidation, other suitable methods, or combinations thereof. In the depicted embodiment, the gate dielectric layer 126 is replaced with a high-k gate dielectric layer (not shown) during the metal gate stack replacement process. A gate hard mask layer 132 may be formed on the dummy gate electrode layer and is used as an etch mask during the patterning of the dummy gate electrode layer. The gate hard mask layer 132 may include any suitable material, such as a silicon oxide, a silicon nitride, a silicon carbide, a silicon oxynitride, other suitable materials, or combinations thereof. In one embodiment, the gate hard mask layer 132 includes dual mask material films 132A and 132B, such as silicon oxide and silicon nitride. In some embodiments, the patterning process to form the dummy gate stacks 130A-130E includes forming a patterned resist layer (not depicted) by one or more lithography processes, etching the gate hard mask layer 132 using the patterned resist layer as an etch mask, and etching the dummy gate electrode layer 131 to form the dummy gate stacks 130A-130E using the patterned hard mask layer 132 as an etch mask. In the depicted embodiment, one or more dummy gate stacks 130 are formed over the dielectric portion 110B of the hybrid fins 110, as shown in FIG. 14D.

In some embodiments, one or more gate spacers (not depicted) are formed on the sidewalls of the dummy gate stacks 130. The gate spacers may include any suitable dielectric material, such as a semiconductor oxide, a semiconductor nitride, a semiconductor carbide, a semiconductor oxynitride, other suitable dielectric materials, or combinations thereof. In some embodiments, the gate spacers may include multiple layers, such as a first gate spacer (or a seal layer) on sidewalls of the dummy gate stacks 130A-130E and a second gate spacer on the first gate spacer. In some embodiments, the gate spacers are formed by deposition and anisotropic etching, such as dry etching. In one such example, the a spacer material is first formed over the workpiece 100 by a deposition process and anisotropically etched back to form the gate spacers along the sidewalls of the dummy gate stacks 130.

Thereafter, referring to FIG. 2B, the method 200 at operation 226 forms epitaxial S/D features 136 (see FIGS. 15A-15E) within the source/drain regions, which are defined in the semiconductor fins 106 and on both sides of the dummy gate stacks 130. The epitaxial S/D features 136 may be formed by selective epitaxy growth for strain effect with enhanced carrier mobility and device performance. The dummy gate stacks 130 and gate spacer constrain the selective epitaxy growth process such that the epitaxial S/D features 136 are self-aligned in the source/drain regions. In many embodiments, the epitaxial S/D features 136 are formed by one or more epitaxial growth (epitaxial process), whereby silicon (Si) features, silicon germanium (SiGe) features, silicon carbide (SiC) features, and/or other suitable semiconductor features are grown in a crystalline state on the semiconductor fins 106 within the source/drain regions. In an alternative embodiment, an etching process is applied to recess portions of the semiconductor fins 106 within the source/drain regions before performing the epitaxy growth. The etching process may also remove any dielectric material disposed on the source/drain regions, such as during the formation of the gate sidewall features. Suitable epitaxy processes include CVD deposition techniques (e.g., vapor-phase epitaxy (VPE) and/or ultra-high vacuum CVD (UHV- CVD), molecular beam epitaxy, and/or other suitable processes. The epitaxial S/D features 136 may be in-situ doped during the epitaxy process by introducing doping species including: p-type dopants, such as boron or $BF_2$; and n-type dopants, such as phosphorus or arsenic. In an exemplary embodiment, the epitaxial S/D features 136 in an nFET include silicon doped with phosphorous (SiP) or silicon carbide doped with phosphorous (SiCP), while those in a pFET include silicon germanium doped with boron (SiGeB), SiGeSnB (tin may be used to tune the lattice constant) and/or GeSnB. In some embodiments, the epitaxial S/D features 136 include more than one semiconductor material layers. One or more annealing processes may be performed thereafter to activate the epitaxial source/drain features 136. Suitable annealing processes include rapid thermal annealing (RTA), laser annealing processes, other suitable annealing technique or a combination thereof.

Referring back to FIG. 2B, the method 200 at operation 228 replaces the dummy gate stacks 130A-130E with metal gate stacks 146A-146E (collectively referred to as metal gate stacks 146; see FIGS. 15A-15E) in a series of processes collectively referred to as "gate replacement process." The gate replacement process at operation 228 begins with depositing the ILD layer 140 over the workpiece 100, covering the isolation features 128, the epitaxial S/D features 136, the dummy gate stacks 130A-130E, and other features formed over the substrate 102. The ILD layer 140 acts as an insulator that supports and isolates conductive traces (such as contacts, vias, and metal lines) to be formed therein. The ILD layer 140 may include any suitable dielectric material, such as a silicon oxide, low-k dielectric material, porous dielectric material, other suitable dielectric material or a combination thereof. In some embodiments, the etch-stop layer 142 is deposited over the workpiece 100 before forming the ILD layer 140. The etch-stop layer 142 includes a material different from that of the ILD layer 140 to provide etching selectivity. For example, the etch-stop layer 142 may include silicon nitride deposited by CVD or ALD. In some embodiments, the formation of the ILD layer 140 includes deposition and CMP to provide a planarized top surface. The gate hard mask layer 132 may be removed during the CMP process, an additional etching operation, or a combination thereof.

The gate replacement process at operation 228 proceeds to form metal gate stacks 146 to replace the dummy gate stacks 130. The dummy gate stacks 130A-130E are first removed by selective etching or a series of patterning and etching processes discussed above. The etching process may be any suitable method, such as dry etching, wet etching, RIE, and/or other suitable methods, resulting in gate trenches (not depicted). After the removal of the dummy gate stacks 130A-130E, materials of the metal gate stacks 146 are deposited in the gate trenches, and a CMP process is applied to remove the excessive gate materials and planarize the top surface.

The materials of the metal gate stacks 146 include a high-k gate dielectric layer and gate electrode (not depicted). In some embodiments, the gate dielectric layer includes a high-k dielectric material, and the gate electrode includes metal or metal alloy. The metal gate stacks 146 are formed on the workpiece 100 wrapping around the channel regions 154 of the semiconductor fins 106. In some examples, the high-k gate dielectric layer and the gate electrode each may include a number of sub-layers. The high-k dielectric layer may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable dielectric materials. The high-k gate dielectric layer may be deposited a suitable technique, such as ALD, CVD, metal-organic CVD (MOCVD), PVD, thermal oxidation, and/or other suitable techniques. The high-k gate dielectric layer may additionally include an interfacial layer disposed between the semiconductor fins 106 and the high-k dielectric layer. The interfacial layer may include may include silicon oxide, silicon nitride, silicon oxynitride, and/or other suitable material, deposited by a suitable method, such as ALD, CVD, ozone oxidation, and/or other suitable methods.

The gate electrode material is then deposited over the high-k gate dielectric layer in the gate trenches. The gate electrode is formed by ALD, PVD, CVD, plating, other suitable process, or a combination thereof. The gate electrode may include a single layer or multiple layers, such as at least one work-function (WF) metal layer, a bulk conductive layer, a metal layer, a barrier layer, and/or an adhesion layer. The gate electrode may include Ru, Cu, W, Co, Ti, Ag, Al, TiAlN, TaC, TaCN, TaSiN, Mn, Zr, TiN, TaN, Mo, WN, or any suitable materials. In some embodiments, different metal materials are used for nFET and pFET devices with respective work functions. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof.

Figure 15B:
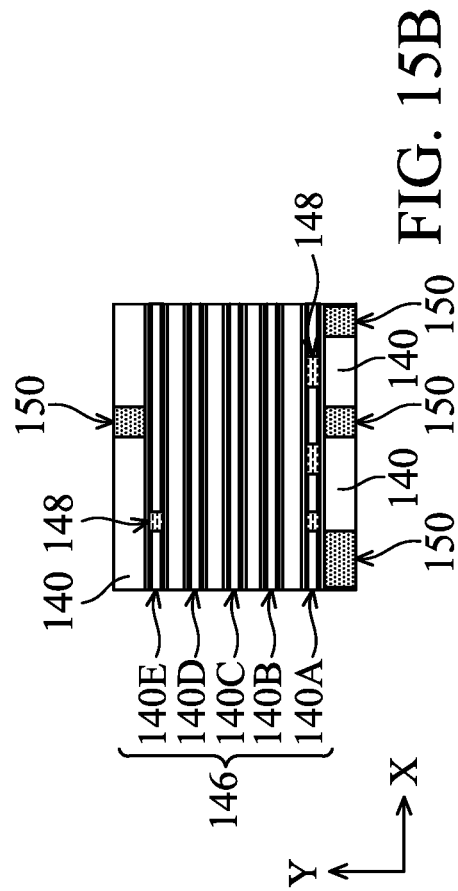
Figure 15C:
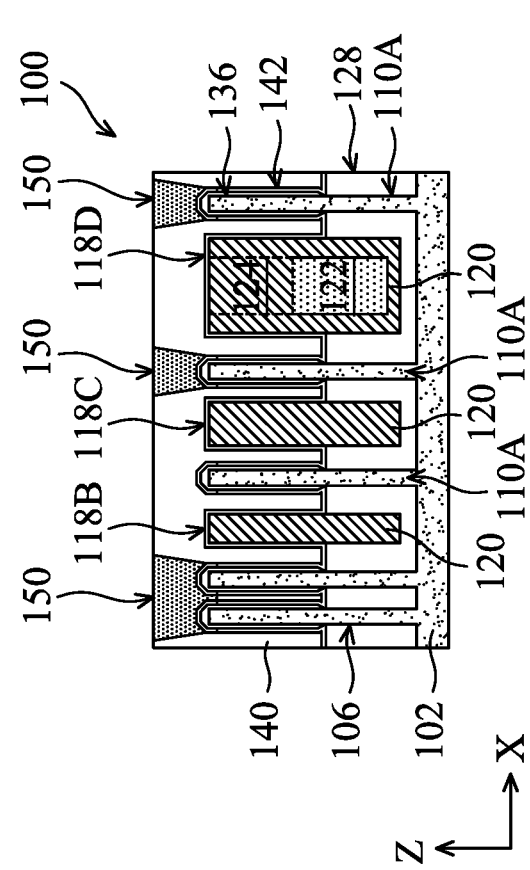
Figure 15A:
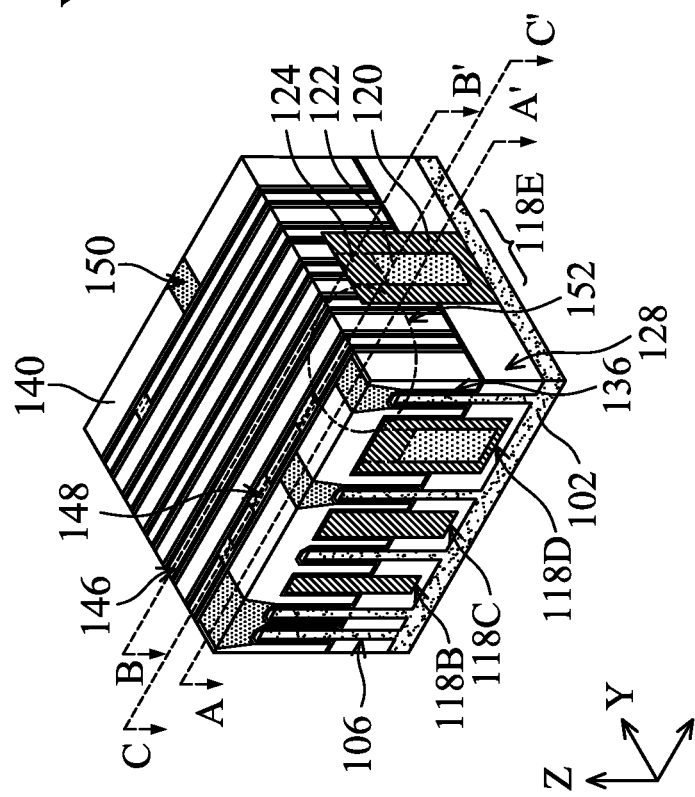
Figure 15D:
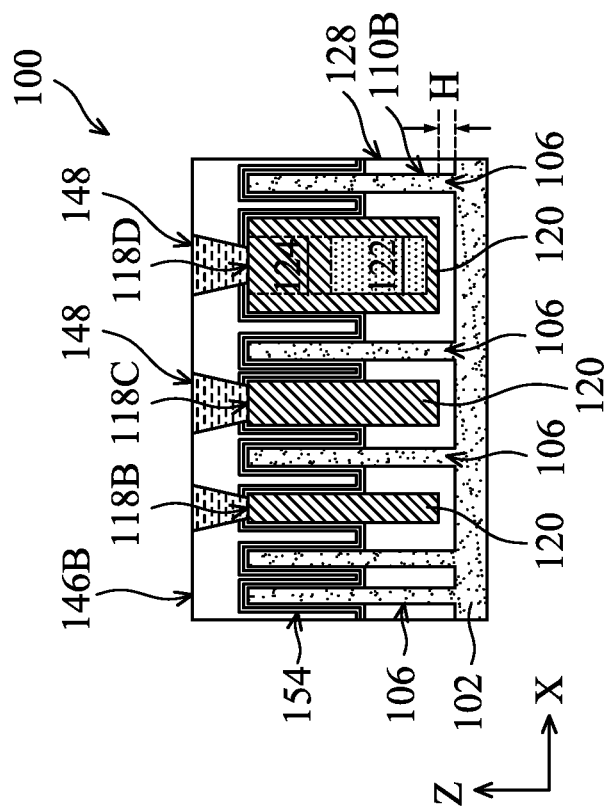
Figure 15E:
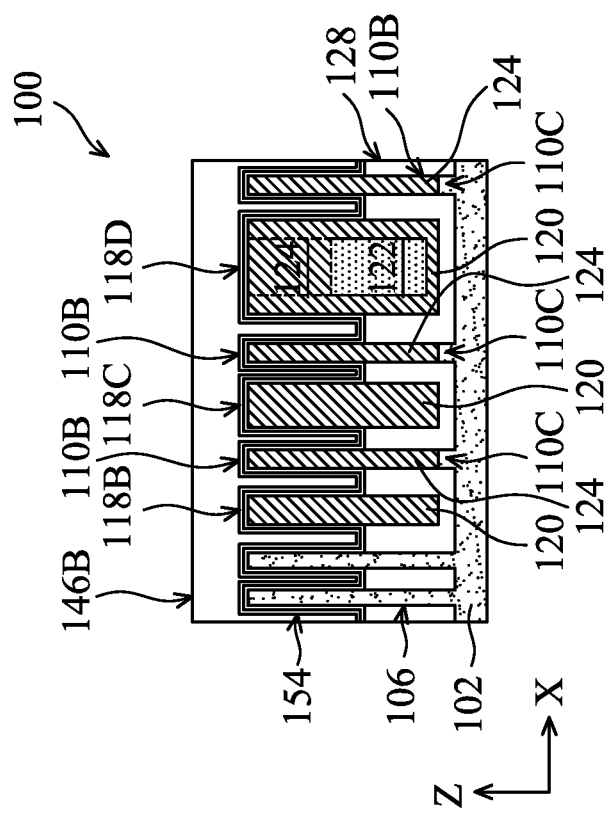
FIG. 15E is a cross-sectional view of the semiconductor structure of FIG. 15A taken along the dashed line CC', constructed in accordance with some embodiments of the present disclosure.

Referring to FIG. 2B and to FIG. 15E, the method 200 at operation 230 cuts (or shortens) the metal gate stacks 146. In the present example, the metal gate stacks 146 are patterned, etched, and filled with one or more dielectric material to form gate cut features 148. Specifically, as discussed above, the gate cut features 148 are formed over the dielectric fins 118B-118D, such that in the event any lateral over-etching were to occur during the CMG process, the semiconductor fins 106 adjacent the dielectric fins 118B-118D will not be unintentionally damaged by the etching process. The gate cut features 148 are dielectric features to define the gate ends and the spacing between the gate ends. The formation of the gate cut features 148 may include lithography process, etching, and deposition, and may be further followed by CMP. For examples, the formation of the gate cut features includes performing a lithography process to form a patterned resist layer with openings that define the regions for gate cut features, performing an etching process to selectively etch the gate stacks through the resist openings to form trenches in the gate stacks, depositing one or more dielectric material to fill in the trenches, and performing a CMP process to remove the excessive the dielectric material. The dielectric material of the gate cut features may include silicon oxide, silicon nitride, low-k dielectric material, other suitable dielectric material, or a combination thereof. In the depicted embodiment, the gate cut features 148 are formed in the metal gate stacks 146; however, the present disclosure is also applicable to embodiments in which the gate cut features 148 are formed in the dummy gate stacks 130 before performing the gate replacement process.

Still referring to FIG. 2B and to FIGS. 15A-15D, the method 200 at operation 232 performs additional processing steps to workpiece 100. For example, the method 200 forms S/D contact features 150 over the epitaxial S/D features 136. The S/D contact features 150 are conductive features to electrically connect the FETs to form a functional circuit. In the present examples, the S/D contact features 150 are designed to land on epitaxial S/D features 136. The formation of the S/D contact features 150 may include lithography process, etching, and deposition, and may be further followed by CMP. For examples, the formation of the contact features includes performing a lithography process to form a patterned resist layer with openings that define the regions for contact features, performing an etching process to the ILD layer 140 through the resist openings to form contact holes in the ILD layer 140, depositing one or more conductive material to fill in the contact holes, and performing a CMP process to remove the excessive the conductive material. The conductive material of the contact features may include W, Cu, Co, Ru, Al, other metal or metal alloys, or a combination thereof. The S/D contact features 150 may further include a barrier layer (such as titanium, titanium nitride, tantalum, tantalum nitride or a combination thereof) for lining the contact holes. For example, the S/D contact features 150 include titanium and titanium nitride as a barrier layer deposited by CVD, ALD, or PVD, and a conductive material to fill in the contact holes by CVD, ALD, PVD, plating, other suitable technique or a combination thereof.

The method 200 may further include other operations during, before and/or after the described operations. For example, the method 200 forms other features such as interconnection features over the workpiece 100. An interconnection structure includes various conductive features to electrically connect various devices (including FETs) to an integrated circuit. The interconnection structure includes contact features, via features and metal lines. The metal lines may be distributed in multiple metal layers and via features vertically connect the metal lines between adjacent metal layers. For example, via features and metal lines may utilize copper technologies and may be formed a damascene process, such as dual damascene process or single damascene process.

The present disclosure provides semiconductor structures including FinFETs and methods of making the same. In particular, embodiments of the present disclosure provide dielectric fins having various compositions and dimensions dispersed among semiconductor (i.e., active) fins for meeting different design requirements and addressing challenges arising from fabricating FinFET devices. Embodiments of the present disclosure provide many advantages. For example, in some embodiments, dielectric fins are formed substantially parallel to semiconductor fins to provide structural support for subsequently formed gate stacks (e.g., metal gate stacks) that may be prone to collapsing in areas where semiconductor fins are sparse or absent. In some examples, such as when fabricating FinFET SRAM devices according to embodiments of the present disclosure, density of fins may range from about 40% to about 70%. In some embodiments, dielectric fins are formed substantially perpendicular to semiconductor fins for mitigating potential damage to semiconductor fins during a cut metal gate process. In some embodiments, hybrid fins including both a semiconductor portion and a dielectric portion are formed substantially parallel to semiconductor fins near and/or under the gate stacks to compensate for possible misalignment (e.g., undesired shift) of metal gate stacks that could lead to structural defects such as metal gate extrusion. In further embodiments, dielectric fins may include a tri-layer composition formed by alternating deposition processes (e.g., a first ALD process followed by an FCVD process, which is followed by a second ALD process) for improved fabrication efficiency and etching selectivity.

In one aspect, the present disclosure provides a semiconductor structure that includes semiconductor fins protruding out of a substrate, dielectric fins protruding out of the substrate and disposed among the semiconductor fins, where the dielectric fins include a first dielectric material layer, a second dielectric material layer disposed over the first dielectric material layer, and a third dielectric material layer disposed over the second dielectric material layer, and gate stacks disposed over the semiconductor fins and the dielectric fins. In some embodiments, the first and second dielectric material layers have different compositions, and the first and the third dielectric material layers have the same compositions.

In some embodiments, the first dielectric material layer includes a nitrogen-containing material, and wherein the second dielectric material layer includes an oxygen-containing material.

In some embodiments, a width of the second dielectric material layer and a width of the third dielectric material layer both span between sidewalls of the first dielectric material layer.

In some embodiments, sidewalls of the first dielectric material layer contacts sidewalls of both the second and the third dielectric material layers.

In some embodiments, the dielectric fins include a first dielectric fin and a second dielectric fin, where the first dielectric fin includes the first dielectric material layer and is free of the second and the third dielectric material layers, and the second dielectric fin includes the first, the second, and the third dielectric material layers. In further embodiments, the semiconductor fins are oriented lengthwise in a first direction, and the first and the second dielectric fins are oriented lengthwise in the first direction, and the dielectric fins further include a third dielectric fin oriented lengthwise in a second direction orthogonal to the first direction.

In some embodiments, the semiconductor structure further includes gate spacers disposed along sidewalls of the gate stacks, where the gate spacers are different from the first and the third dielectric material layers in composition.

In some embodiments, the semiconductor structure further includes hybrid fins protruding out of the substrate and disposed among the semiconductor fins and the dielectric fins, where a first portion of the hybrid fins and the third dielectric material layer of the dielectric fins are the same in composition and a second portion of the hybrid fins and the semiconductor fins are the same in composition. In some embodiments, sidewalls of the first portion and the second portion are continuous. In further embodiments, a bottom surface of the first portion of the hybrid fins contacts the second portion of the hybrid fins.

In another aspect, the present disclosure provides a method that includes forming a semiconductor fin structure over a substrate, filling the trenches with a first dielectric material layer and a second dielectric material layer over the first dielectric material layer, where the second dielectric material layer including a composition different from the first dielectric material layer, resulting in a dielectric fin structure having a plurality of dielectric fins, removing a portion of the second dielectric material layer to form a first recess, after the removing of the portion of the second dielectric material layer, removing portions of the semiconductor fins, resulting in a second recess formed in portions of the semiconductor fins, filling the first and the second recesses with a third dielectric material layer, where the third dielectric material layer includes a composition the same as the first dielectric material layer, and forming gate stacks over the semiconductor fins and the dielectric fins. In some embodiments, the semiconductor fin structure includes a plurality of semiconductor fins and defines trenches among the semiconductor fins.

In some embodiments, filling the trenches includes performing an atomic layer deposition (ALD) process to deposit the first dielectric material layer in the trenches, and depositing the second dielectric material layer over the first dielectric material layer to fill the trenches, where the depositing is implemented by a flowable chemical vapor deposition (FCVD) process. In further embodiments, the trenches include a first trench having a first width and a second trench having a second width greater than the first width, where the performing of the ALD process includes depositing the first dielectric material layer to completely fill the first trench, and the depositing of the second dielectric material layer includes depositing the second dielectric material layer in the second trench.

In some embodiments, the filling of the first and the second recesses includes performing an ALD process.

In some embodiments, the removing of the portion of the semiconductor fins exposes the substrate in the second recess, and the filling of the second recess forms a dielectric fin on the substrate.

In some embodiments, the removing of the portion of the semiconductor fins exposes the semiconductor fins in the second recess, and the filling of the second recess forms a dielectric fin on the semiconductor fins.

In some embodiments, the method further includes performing a first chemical mechanical polishing (CMP) process to the second dielectric material layer after the filling of the trenches and performing a second CMP process to the third dielectric material layer after the filling of the first and the second recesses.

In yet another aspect, the present disclosure provides a semiconductor structure that includes first fins disposed on a substrate and oriented lengthwise along a first direction, where the first fins include a semiconductor material, second fins disposed among the first fins and oriented lengthwise along the first direction, where the second fins include a first dielectric material layer, third fins disposed among the first fins and the second fins and oriented lengthwise along the first direction, and gate stacks disposed over the first, the second, and the third fins, the gate stacks being oriented lengthwise along a second direction orthogonal to the first direction. In some embodiments, a first portion of each of the third fins includes the semiconductor material and a second portion of each of the third fins includes a second dielectric material layer having the same composition as the first dielectric material layer.

In some embodiments, the second fins further include a third dielectric material layer disposed over the first dielectric material layer and a fourth dielectric material layer disposed over the third dielectric material layer, where the third dielectric material layer is different from the first dielectric material layer in composition and the fourth dielectric material layer is the same as the first dielectric material layer in composition.

In some embodiments, sidewalls of the first portion of each of the third fins are coplanar with sidewalls of the second portion of the each of the third fins along the first direction.

In some embodiments, a bottom surface of the second portion of each of the third fins is below a bottom surface of each of the second fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first fin structure disposed on a substrate, the first fin structure including:
      a first semiconductor material layer having a first portion disposed over a first region of the substrate and a second portion disposed over a second region of the substrate, the first portion of the first semiconductor material layer extending to a first height above the substrate and the second portion of the first semiconductor material layer extending to a second height that is less than the first height; and
      a first dielectric material layer disposed directly on the second portion of the first semiconductor material layer, the first dielectric material layer extending to the first height above the substrate; and
   a first gate stack disposed at least partially over the first dielectric material layer of the first fin structure.

2. The device of claim 1, further comprising a first dielectric fin disposed on the substrate, and
   wherein the first gate stack further extends over the first dielectric fin.

3. The device of claim 2, further comprising a second dielectric fin disposed on the substrate, and
   wherein the first gate stack further extends over the second dielectric fin, the second dielectric fin formed of a different material than the first dielectric fin.

4. The device of claim 3, wherein the second dielectric fin is wider than the first dielectric fin.

5. The device of claim 2, further comprising a second dielectric fin disposed on the substrate, and
   wherein the first gate stack further extends over the second dielectric fin, the second dielectric fin formed of the same material as the first dielectric fin.

6. The device of claim 5, wherein the second dielectric fin is wider than the first dielectric fin.

7. The device of claim 1, further comprising a source/drain feature disposed on the first portion of the first semiconductor material layer.

8. A device comprising:
   a first fin structure disposed on a substrate and extending lengthwise along a first direction, the first fin structure including:
      a first semiconductor material layer disposed over a first region of the substrate; and
      a first dielectric material layer disposed over a second region of the substrate,
   wherein sidewall of the first dielectric material layer and sidewalls of the first semiconductor material layer are continuous along the first direction;

a second fin structure disposed over a third region of the substrate, the second fin structure including a second semiconductor material layer extending from the substrate; and a first gate stack disposed directly over the first dielectric material layer of the first fin structure and the second semiconductor material layer of the second fin structure.

9. The device of claim 8, wherein a portion of the first semiconductor layer extends under the first dielectric material layer disposed over the second region of the substrate.

10. The device of claim 8, wherein the first semiconductor material layer of the first fin structure, the first dielectric material layer of the first fin structure and the second fin structure have the same width along a second direction perpendicular to the first direction.

11. The device of claim 8, wherein the first semiconductor material layer and the second semiconductor material layer are formed of the same material.

12. The device of claim 8, further comprising:
a dielectric isolation structure disposed on the substrate and extending from the second fin structure to the first fin structure; and
a dielectric fin structure at least partially embedded within the dielectric isolation structure, and
wherein the first gate stack is further disposed directly over the dielectric fin structure.

13. The device of claim 12, wherein the dielectric fin structure includes:
a first material layer defining a recess;
a second material layer disposed in the recess and interfacing with the first material layer; and
a third material layer disposed in the recess and interfacing with the first material layer.

14. The device of claim 8, further comprising:
a second gate stack disposed directly over the first semiconductor material layer;
a first dielectric fin disposed on the substrate, and
a first gate cut feature extending to and interfacing with the first dielectric fin and the second gate stack.

15. The device of claim 14, further comprising:
a second dielectric fin disposed on the substrate, the second dielectric fin having a different width than the first dielectric fin; and a second gate cut feature extending to and interfacing with the second dielectric fin and the second gate stack.

16. A device comprising:
a dielectric isolation structure disposed on a substrate;
a first fin structure disposed on the substrate and extending through the dielectric isolation structure, the first fin structure including:
a first semiconductor material portion extending from the substrate; and
a first dielectric material portion extending from the first semiconductor portion;
a first dielectric fin structure disposed on the substrate and extending through the dielectric isolation structure, the first dielectric fin structure having a first width and being formed of a second dielectric material portion; and
a second dielectric fin structure disposed on the substrate and extending through the dielectric isolation structure, the second dielectric fin structure having a second width that is different than the first width and being formed of a third dielectric material portion that has a different material composition than the second dielectric material portion, and
wherein the first fin structure, the first dielectric fin structure and the second dielectric fin structure extend to the same height above the substrate.

17. The device of claim 16, wherein the first dielectric material portion and the second dielectric material portion are formed of the same material.

18. The device of claim 16, wherein the first dielectric material portion includes a first nitride material and the second dielectric material portion includes a second nitride material.

19. The device of claim 16, further comprising a second fin structure disposed on the substrate, the second fin structure including a second semiconductor material layer extending from the substrate to the same height above the substrate as the first fin structure, the first dielectric fin structure and the second dielectric fin structure.

20. The device of claim 16, further comprising a first gate stack extending directly over the first fin structure, the first dielectric fin structure and the second dielectric fin structure.

* * * * *